United States Patent
Lee et al.

(10) Patent No.: US 9,704,721 B2
(45) Date of Patent: Jul. 11, 2017

(54) METHOD OF FORMING KEY PATTERNS AND METHOD OF FABRICATING A SEMICONDUCTOR DEVICE USING THE SAME

(71) Applicants: Hyunchang Lee, Gwangmyeong-si (KR); Boo-Hyun Ham, Yongin-si (KR); Yongkug Bae, Hwaseong-si (KR); Ja-Min Koo, Hwaseong-si (KR); Jonghwa Baek, Yongin-si (KR); Heeju Shin, Yongin-si (KR); Rankyung Jung, Incheon (KR)

(72) Inventors: Hyunchang Lee, Gwangmyeong-si (KR); Boo-Hyun Ham, Yongin-si (KR); Yongkug Bae, Hwaseong-si (KR); Ja-Min Koo, Hwaseong-si (KR); Jonghwa Baek, Yongin-si (KR); Heeju Shin, Yongin-si (KR); Rankyung Jung, Incheon (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 52 days.

(21) Appl. No.: 14/943,642

(22) Filed: Nov. 17, 2015

(65) Prior Publication Data
US 2016/0155662 A1    Jun. 2, 2016

(30) Foreign Application Priority Data
Nov. 28, 2014   (KR) .................. 10-2014-0168738

(51) Int. Cl.
*H01L 21/302*   (2006.01)
*H01L 21/461*   (2006.01)
*H01L 21/311*   (2006.01)
*H01L 21/033*   (2006.01)
*H01L 23/544*   (2006.01)
*H01L 21/768*   (2006.01)

(52) U.S. Cl.
CPC .... *H01L 21/31144* (2013.01); *H01L 21/0337* (2013.01); *H01L 21/76897* (2013.01); *H01L 23/544* (2013.01); *H01L 2223/5442* (2013.01); *H01L 2223/5446* (2013.01); *H01L 2223/54426* (2013.01)

(58) Field of Classification Search
None
See application file for complete search history.

(56) References Cited

U.S. PATENT DOCUMENTS

| | | | |
|---|---|---|---|
| 6,506,623 B2 | 1/2003 | Teshima et al. | |
| 7,709,396 B2 | 5/2010 | Bencher et al. | |
| 8,163,190 B2 | 4/2012 | Moon | |
| 8,440,569 B2 | 5/2013 | Weling et al. | |

(Continued)

FOREIGN PATENT DOCUMENTS

KR    1020090079713    7/2009

*Primary Examiner* — Angel Roman
(74) *Attorney, Agent, or Firm* — Harness, Dickey & Pierce P.L.C.

(57) ABSTRACT

Provided are a method of forming key patterns and a method of fabricating a semiconductor device using the same. The method of forming key patterns may include forming gate and key patterns on a cell region and a scribe lane region, respectively. Here, the key patterns may be formed to have a large width and a larger pitch than those of the gate patterns.

20 Claims, 32 Drawing Sheets

(56) References Cited

U.S. PATENT DOCUMENTS

| | | |
|---|---|---|
| 8,461,053 B2 | 6/2013 | Chen et al. |
| 8,518,831 B2 | 8/2013 | Hwang |
| 8,541,306 B2 | 9/2013 | Yang et al. |
| 8,633,076 B2 | 1/2014 | Wang et al. |
| 8,669,186 B2 | 3/2014 | LiCausi |
| 8,889,561 B2 | 11/2014 | Woo et al. |
| 9,054,164 B1 * | 6/2015 | Jezewski ............ H01L 21/76879 |
| 2013/0270716 A1 * | 10/2013 | Kim ...................... H01L 23/522 |
| | | 257/775 |
| 2014/0083972 A1 | 3/2014 | Oyama et al. |
| 2016/0314983 A1 * | 10/2016 | Han .................... H01L 21/3086 |

* cited by examiner

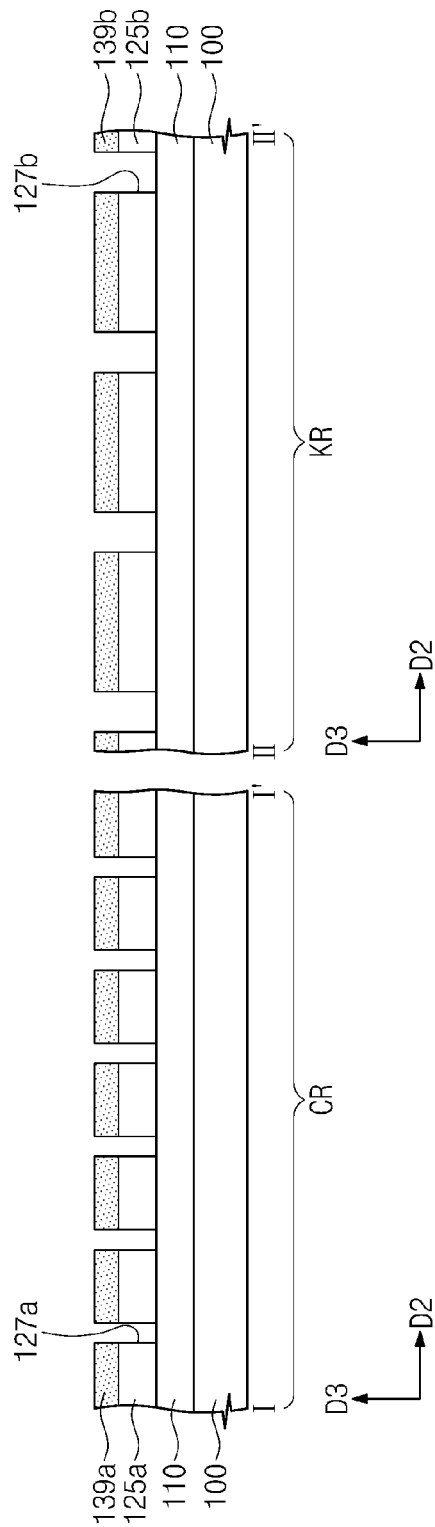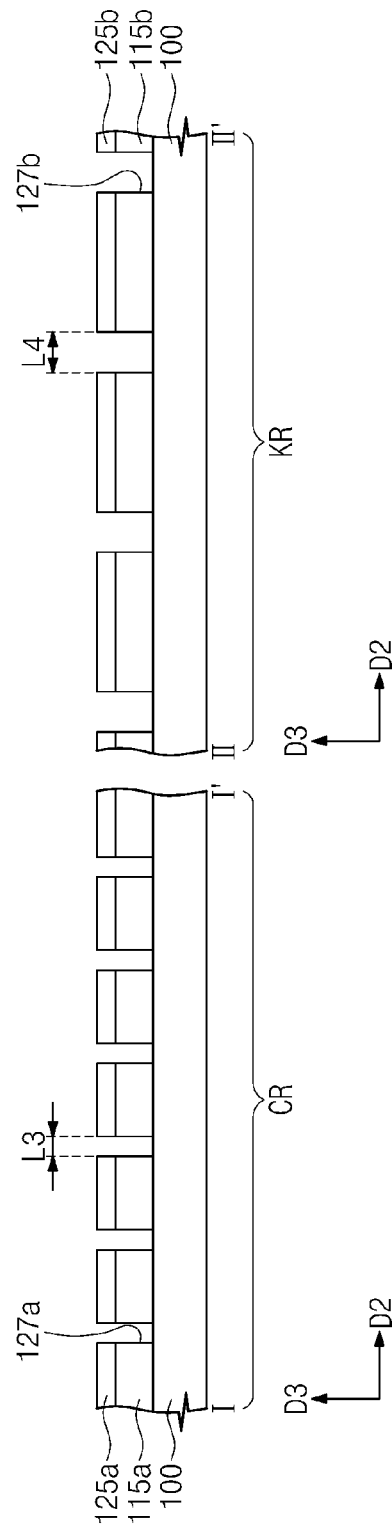

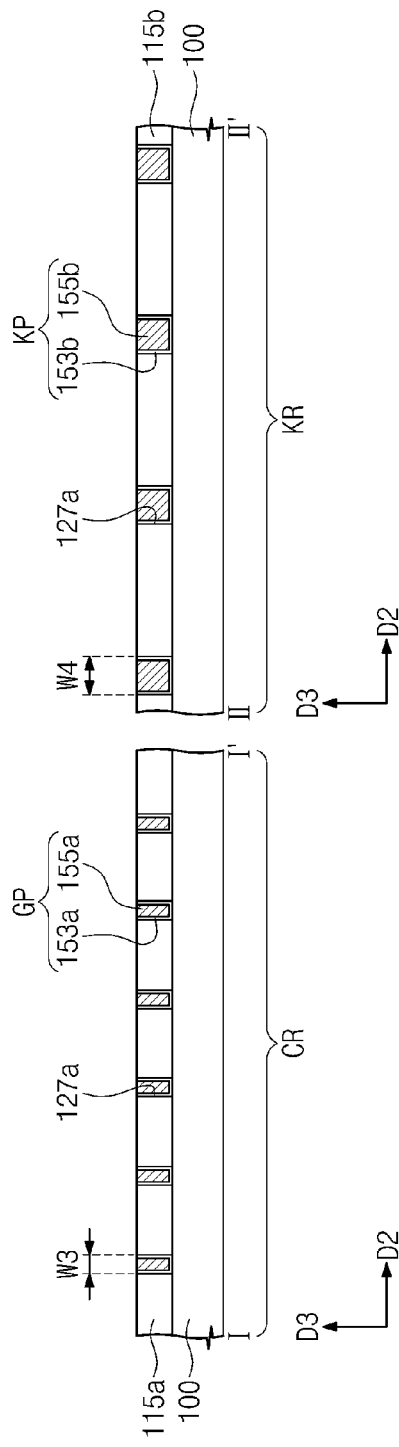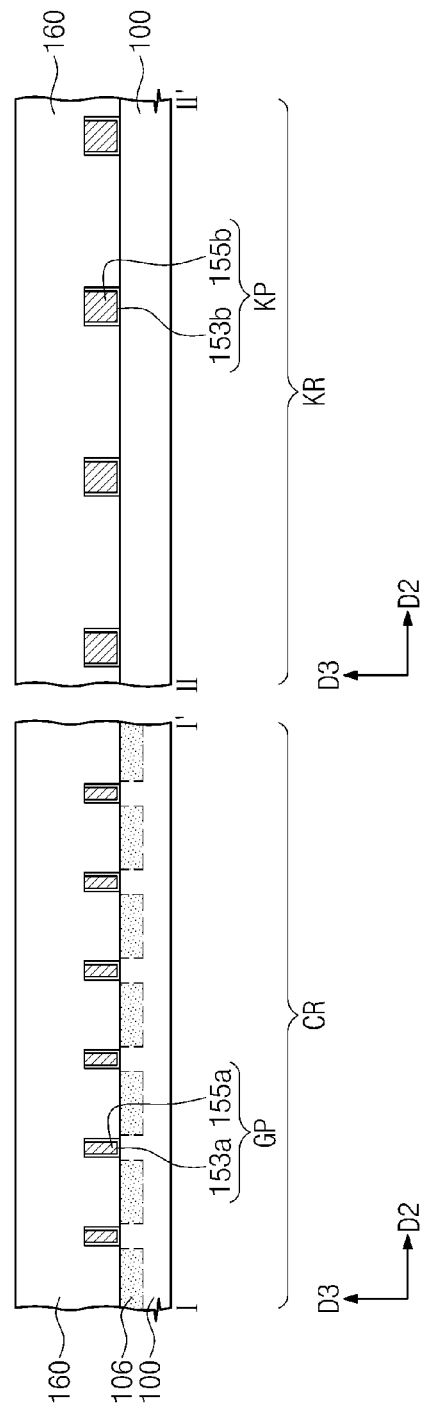

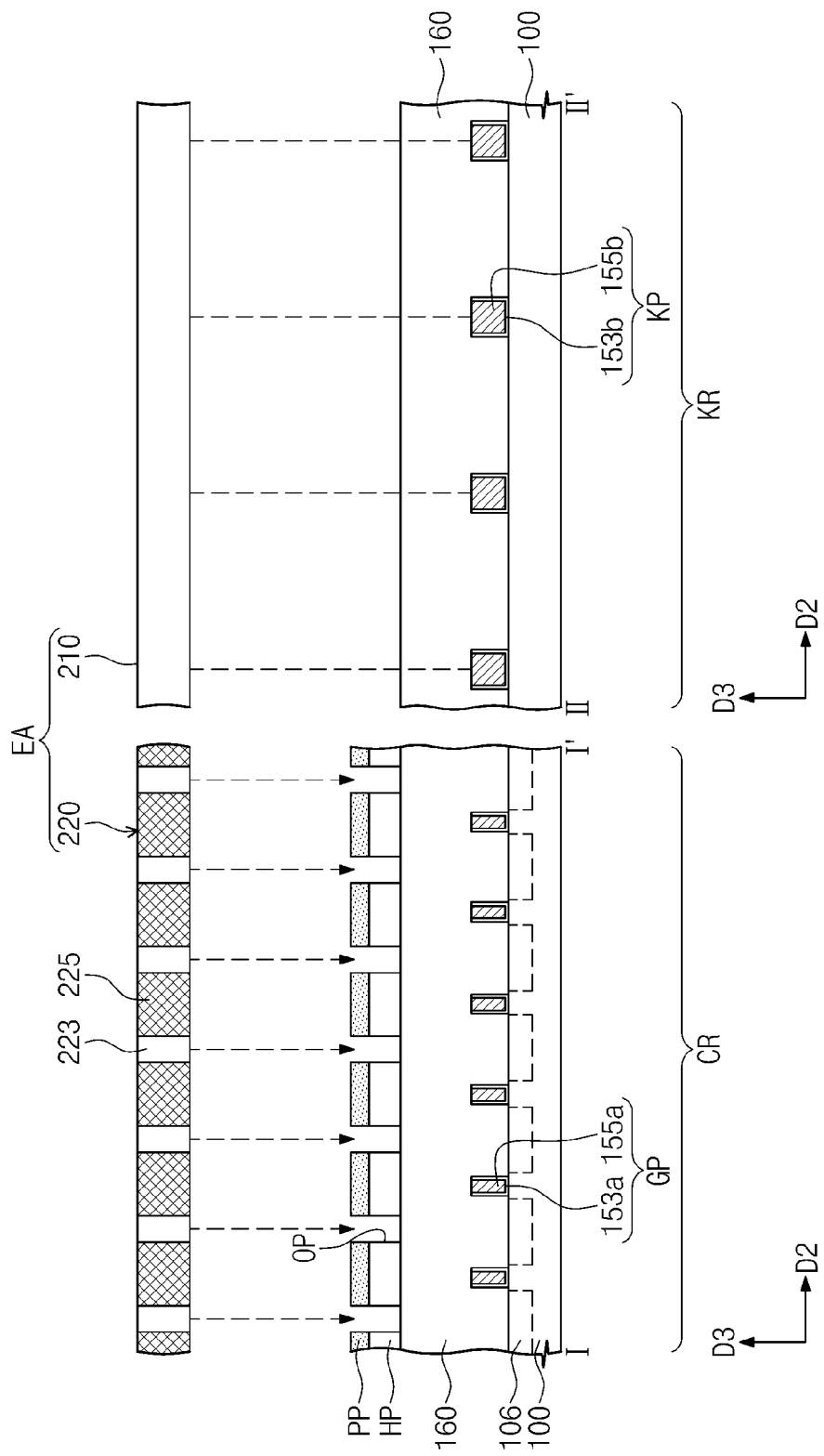

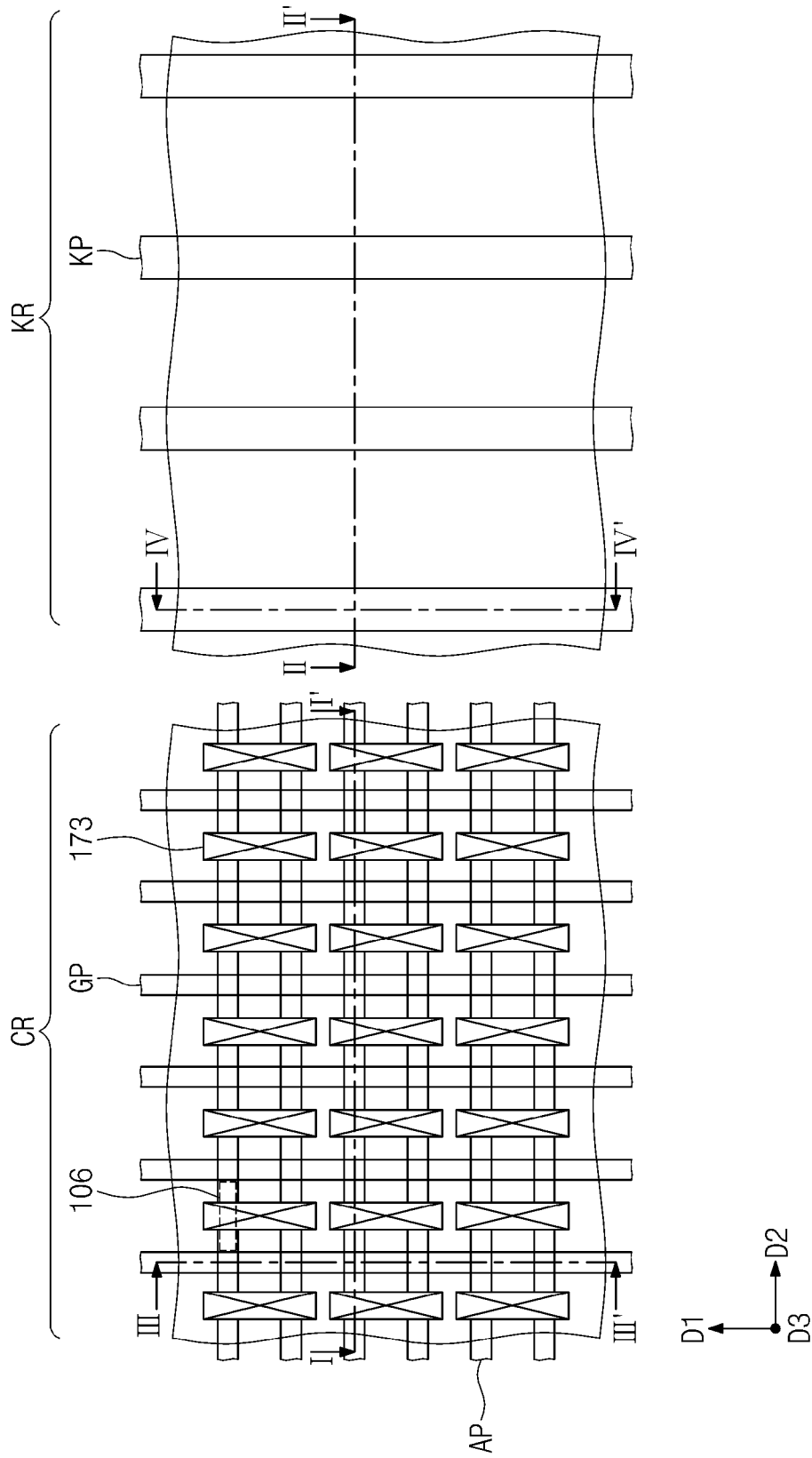

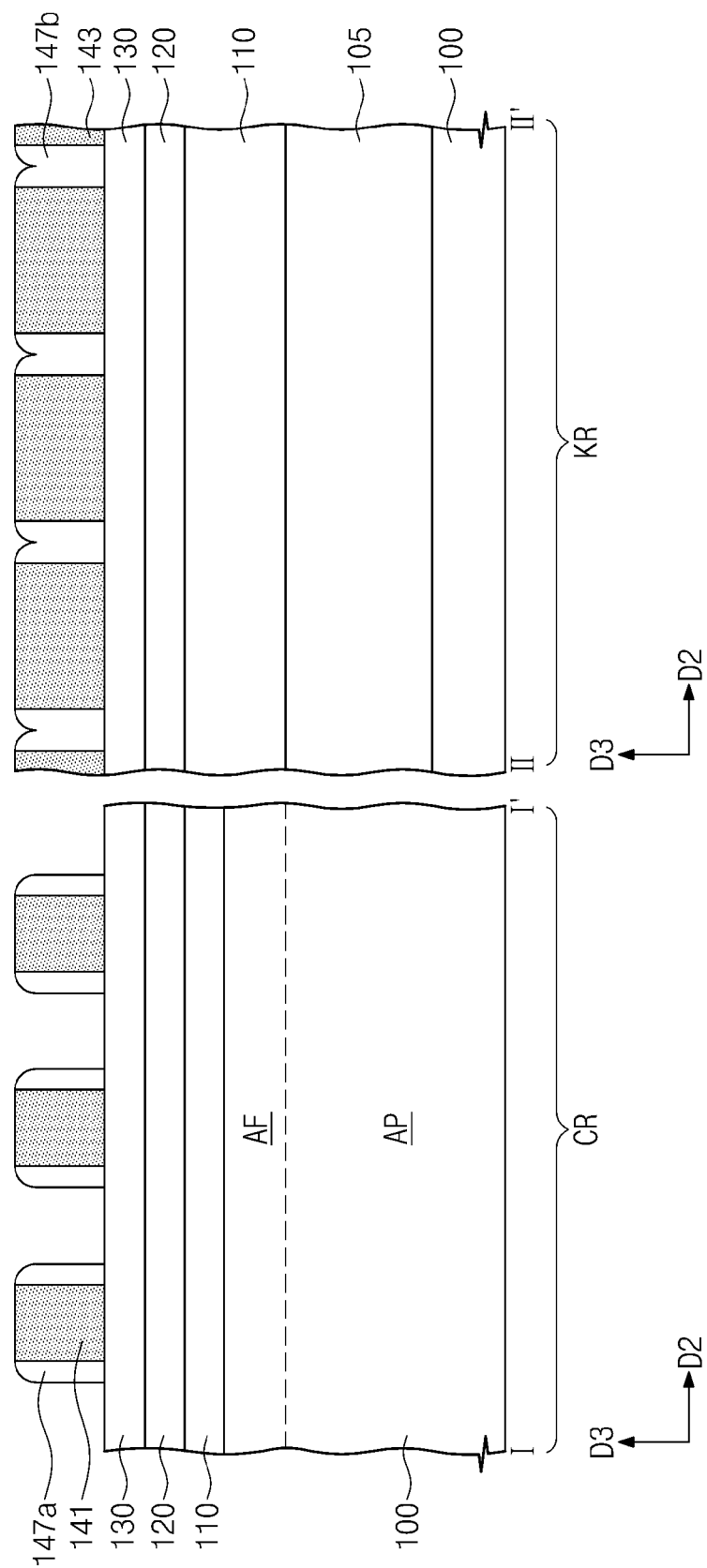

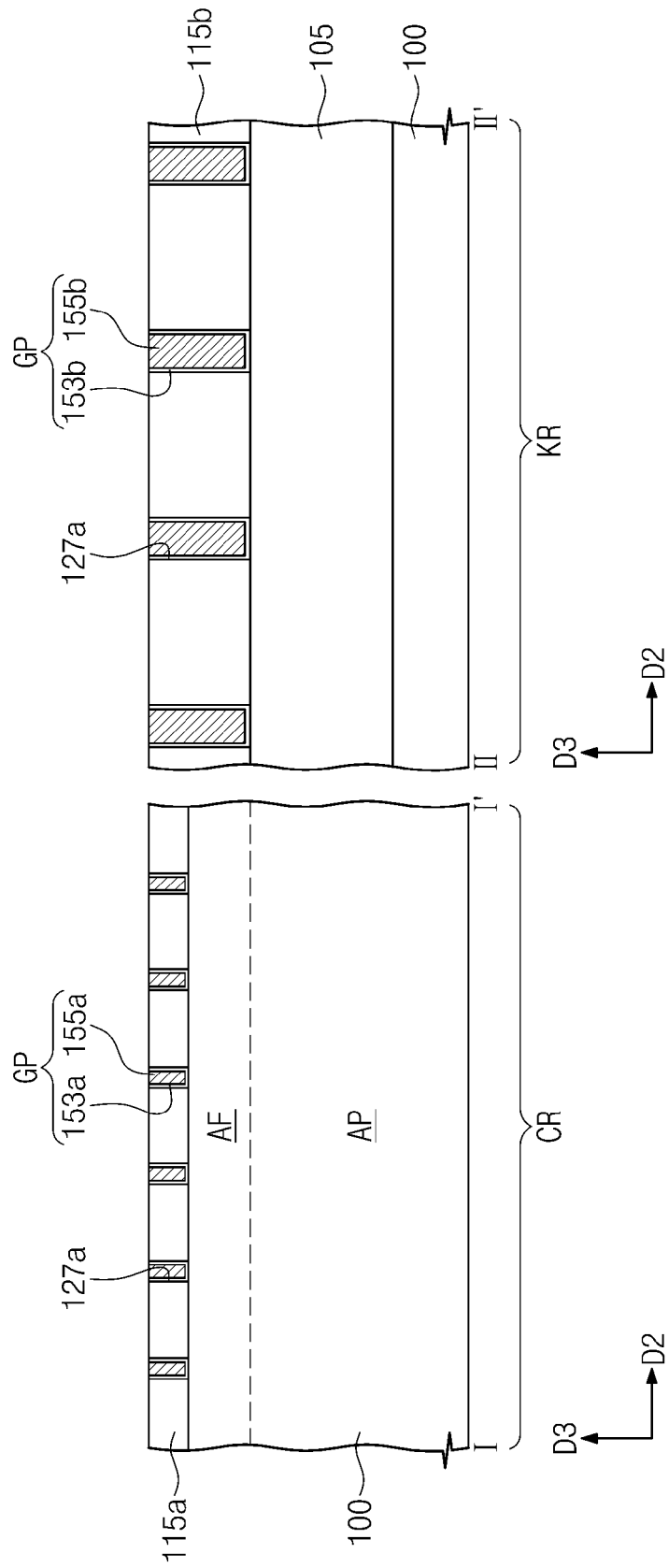

333
METHOD OF FORMING KEY PATTERNS AND METHOD OF FABRICATING A SEMICONDUCTOR DEVICE USING THE SAME

CROSS-REFERENCE TO RELATED APPLICATIONS

This U.S. non-provisional patent application claims priority under 35 U.S.C. §119 from Korean Patent Application No. 10-2014-0168738, filed on Nov. 28, 2014, in the Korean Intellectual Property Office, the entire contents of which are hereby incorporated by reference.

BACKGROUND OF THE INVENTION

Example embodiments of the inventive concepts relate to a method of forming key patterns and a method of fabricating a semiconductor device using the same, and/or to a method of fabricating a semiconductor device with field effect transistors.

Semiconductor devices are increasingly being used in consumer, commercial and other electronic devices. The semiconductor devices may be classified into a memory device for storing data, a logic device for processing data, and a hybrid device including both memory and logic elements. Due to the increased demand for electronic devices with fast speed and/or low power consumption, it would be advantageous for semiconductor devices to provide high reliability, high performance, and/or multiple functions. To satisfy these technical requirements, complexity and/or integration density of semiconductor devices are increased.

SUMMARY

Example embodiments of the inventive concepts provide a method of forming key patterns without a process defect (e.g., void).

Other example embodiments of the inventive concepts provide a method of fabricating a semiconductor device in which contact plugs are aligned using defect-free key patterns.

According to example embodiments of the inventive concepts, a method of forming key patterns may include forming a first mold layer and a second mold layer on a substrate, forming sacrificial patterns on the second mold layer, forming a spacer layer to conformally cover the sacrificial patterns, anisotropically etching the spacer layer to form spacers at both sides of the sacrificial patterns, a pair of the spacers filling a space between an adjacent pair of the sacrificial patterns, etching the second mold layer using the spacers as an etch mask to form preliminary trenches, forming mask patterns in the preliminary trenches, etching the first mold layer using the mask patterns as an etch mask to form trenches, and filling the trenches with a conductive material to form key patterns in the trenches.

In example embodiments, a distance between the adjacent pair of sacrificial patterns may be 1.5-2.5 times a thickness of the spacer layer.

In example embodiments, one or more of the key patterns may be formed to have a width corresponding to the distance between the adjacent pair of sacrificial patterns.

In example embodiments, the forming of the spacers may include anisotropically etching the spacer layer to expose top surfaces of the sacrificial patterns, and selectively removing the sacrificial patterns.

In example embodiments, the trenches may be formed at the same positions as the positions of, or superimposed to, the spacers, when viewed in a plan view.

In example embodiments, the method may further include forming a third mold layer interposed between the substrate and the first mold layer. The forming of the trenches may include etching the first mold layer using the mask patterns as an etch mask to form mold mask patterns, and etching the third mold layer using the mold mask patterns as an etch mask to form the trenches.

In example embodiments, the method may further include forming a third mold layer interposed between the substrate and the first mold layer. The second mold layer may include a silicon oxide layer, a silicon nitride layer, or a silicon oxynitride layer, the third mold layer may include a silicon oxide layer, a silicon nitride layer, or a silicon oxynitride layer, and the first mold layer may include a material having an etch selectivity with respect to the second and third mold layers.

In example embodiments, a distance between the adjacent pair of sacrificial patterns may be 1.5-2 times the thickness of the spacer layer, and the spacers may be formed to connect respective adjacent pairs of the sacrificial patterns to each other, thereby serving as connection spacers filling spaces between the adjacent pairs of the sacrificial patterns.

In example embodiments, the pair of sacrificial patterns may be spaced apart from each other in a specific direction by a specific distance, and a maximum width of the connection spacer in the specific direction may be substantially the same as the distance between the pair of sacrificial patterns.

In example embodiments, a distance between the adjacent pair of sacrificial patterns may be 2-2.5 times the thickness of the spacer layer, and the pair of the spacers may be spaced apart from each other between the adjacent pair of sacrificial patterns to form an empty space.

In example embodiments, the empty space may have a width of substantially 10 nm or less.

In example embodiments, the method may further include forming a third mold layer interposed between the substrate and the first mold layer. The forming of the preliminary trenches and the trenches may include etching the second mold layer using the spacers as an etch mask to form the preliminary trenches and grooves, the grooves formed in the second mold layer to extend from the empty spaces toward the substrate, forming the mask patterns in the preliminary trenches, etching the first mold layer using the mask patterns as an etch mask to form mold mask patterns, and etching the third mold layer using the mold mask patterns as an etch mask to form the trenches extending into the third mold layer. The grooves may have bottom surfaces positioned at substantially the same level as or a higher level than the level of bottom surfaces of the preliminary trenches.

In example embodiments, the grooves may have widths gradually decreasing in a direction toward the substrate, and the grooves may have an upper width of substantially 10 nm or less.

According to example embodiments of the inventive concepts, a method of fabricating a semiconductor device may include providing a substrate including a first region and a second region, forming a first mold layer and a second mold layer to cover the first region and the second region of the substrate, forming first and second sacrificial patterns on the first and second regions, respectively, of the second mold layer, forming a spacer layer on the substrate to conformally cover the first and second sacrificial patterns, anisotropically etching the spacer layer to form first and second spacers on both side surfaces of the first and second sacrificial patterns, respectively, etching the second mold layer using the first and second spacers as an etch mask to form first and second preliminary trenches on the first and second regions, respectively, forming first and second mask patterns in the first and second preliminary trenches, respectively, and etching the first mold layer using the first and second mask patterns as an etch mask to form first trenches and second trenches, respectively. A width of one or more of the second sacrificial patterns may be greater than the width of one or more of the first sacrificial patterns.

In example embodiments, a width of one or more of the second sacrificial patterns may be 1.5-2 times the width of one or more of the first sacrificial patterns.

In example embodiments, a pitch of the second sacrificial patterns may be substantially equal to the pitch of the first sacrificial patterns.

In example embodiments, a distance between an adjacent pair of the first sacrificial patterns may be greater than the distance between an adjacent pair of the second sacrificial patterns.

In example embodiments, a distance between an adjacent pair of the second sacrificial patterns may be 1.5-2.5 times the thickness of the spacer layer.

In example embodiments, the forming of the first and second spacers may include anisotropically etching the spacer layer to expose top surfaces of the first and second sacrificial patterns, and selectively removing the first and second sacrificial patterns.

In example embodiments, the first and second trenches may be respectively formed at the same positions as, or superimposed to, the positions of the first and second spacers.

In example embodiments, the method may further include forming a third mold layer interposed between the substrate and the first mold layer. The forming of the first and second trenches may include etching the first mold layer using the first and second mask patterns as an etch mask to form first and second mold mask patterns on the first and second regions, respectively, and etching the third mold layer using the first and second mold mask patterns as an etch mask to form the first and second trenches extending into the third mold layer.

In example embodiments, the second spacers may be formed to connect respective adjacent pairs of the second sacrificial patterns to each other, thereby serving as connection spacers filling spaces between the adjacent pairs of the second sacrificial patterns.

In example embodiments, a width of one or more of the connection spacers may be 1.5-2 times the maximum width of one or more of the first spacers.

In example embodiments, a pair of the second spacers may be formed in a space between a pair of the second sacrificial patterns, the pair of the second sacrificial patterns may be spaced apart from each other in a specific direction, and the pair of the second spacers may be spaced apart from each other in the specific direction.

In example embodiments, a maximum width of one or more of the second spacers may be substantially the same as the width of one or more of the first spacers.

In example embodiments, a maximum distance between the pair of the second spacers may be equal to or smaller than substantially 10 nm.

In example embodiments, the method may further include filling the first and second trenches with a conductive material to form gate and key patterns in the first and second trenches, respectively.

In example embodiments, the forming of the gate patterns and the key patterns may include forming a gate dielectric layer in the first and second trenches, before the filling of the first and second trenches with the conductive material.

In example embodiments, a width of one or more of the gate patterns corresponds to the width of one or more of the first spacers, and a width of one or more of the key patterns corresponds to a distance between an adjacent pair of the second sacrificial patterns.

In example embodiments, the method may further include forming an interlayered insulating layer to cover the gate and key patterns, forming contact holes at both sides of the gate patterns to penetrate the interlayered insulating layer and expose a top surface of the substrate, and forming contact plugs in the contact holes, respectively. The contact holes may be aligned to positions between the gate patterns, using the key patterns.

In example embodiments, the method may further include patterning the substrate to form an active fin on the first region. The gate patterns may be formed to cross the active fin.

In example embodiments, the forming of the active fin may include patterning the substrate to form device isolation trenches on the first region, forming a device isolation layer to fill the device isolation trenches, and recessing a top surface of the device isolation layer to form device isolation patterns having top surfaces lower than the top surface of the substrate.

In example embodiments, the method may further include forming source/drain regions on portions of the active fin positioned between the gate patterns. The contact holes may be formed to expose top surfaces of the source/drain regions.

According to example embodiments of the inventive concepts, a semiconductor device may include a substrate including a first region and a second region, gate patterns provided on the first region, and key patterns provided on the second region. A width of the key patterns may be 1.5-2.5 times the width of the gate patterns, and the gate and key patterns may include the same material.

In example embodiments, a distance between an adjacent pair of the key patterns may be 1.5-2 times the distance between an adjacent pair of the gate patterns.

In example embodiments, a pitch of the key patterns may be two times the pitch of the gate patterns.

According to example embodiments of the inventive concepts, a method of fabricating a semiconductor device may include providing a substrate including a first region and a second region, forming gate patterns provided on the first region, and forming key patterns provided on the second region. A width of the key patterns may be 1.5-2.5 times the width of the gate patterns, and the gate and key patterns may include the same material.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 3A through 3K are sectional views illustrating a method of fabricating a semiconductor device according to example embodiments of the inventive concepts;

FIG. 7 is a plan view illustrating a semiconductor device according to still other example embodiments of the inventive concepts;

FIGS. 9A through 13A are sectional views taken along lines I-I' and II-II' of FIG. 7 to illustrate a method of fabricating a semiconductor device according to other example embodiments of the inventive concepts;

FIGS. 9B through 13B are sectional views taken along lines III-III' and IV-IV' of FIG. 7 to illustrate the method of fabricating a semiconductor device according to other example embodiments of the inventive concepts.

Figure 1:
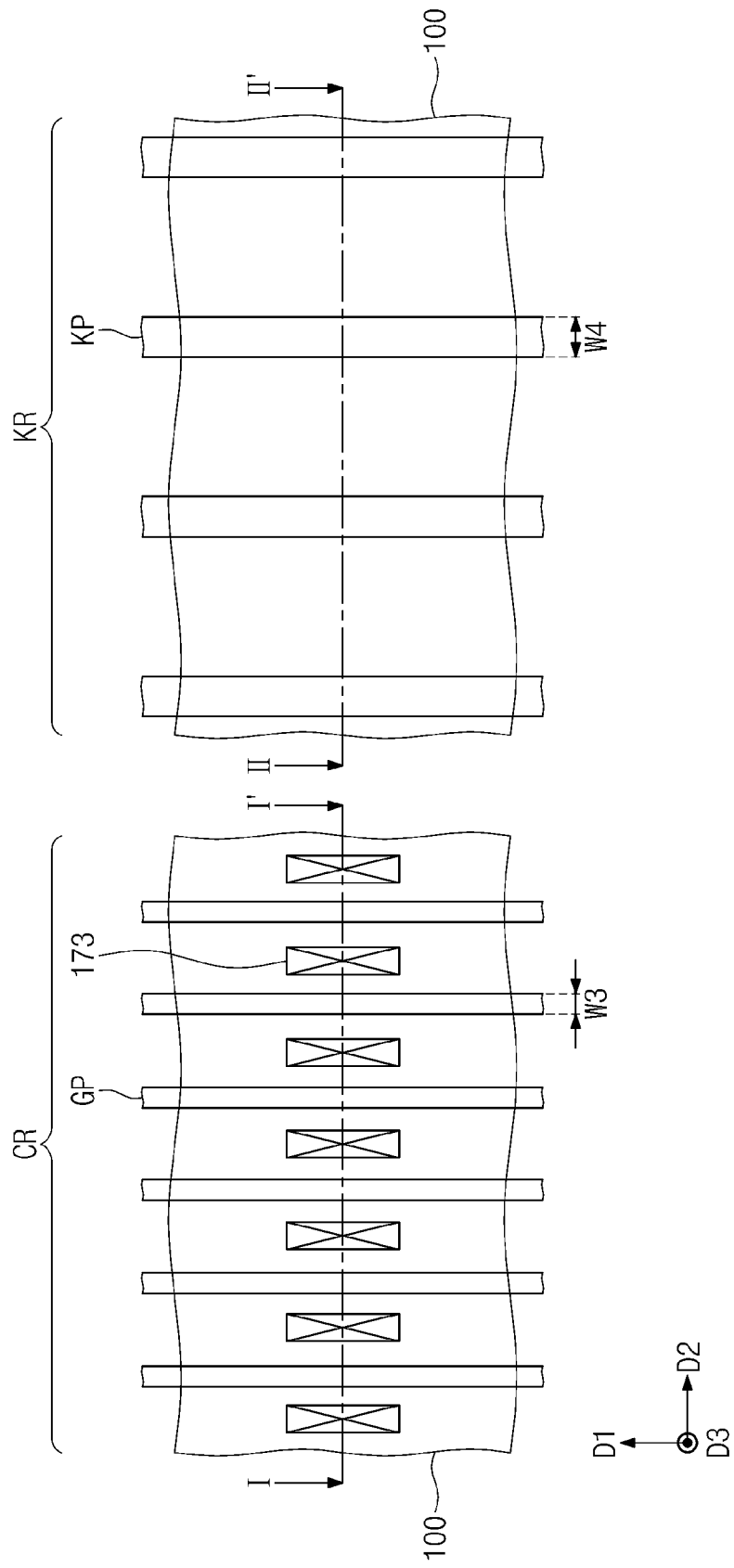
FIG. 1 is a plan view illustrating a semiconductor device according to example embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concepts of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "on," "connected" or "coupled" to another element, it can be directly on, directly connected or coupled to the other element or intervening elements may be present. In contrast, when an element is referred to as being "directly on," "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Although corresponding plan views and/or perspective views of some cross-sectional view(s) may not be shown, the cross-sectional view(s) illustrated herein provide support for a plurality of devices according to various embodiments described herein that extend along two different directions in a plan view and/or in three different directions in a perspective view. The two different directions may or may not be orthogonal to each other. The three different directions may include a third direction that may be orthogonal to the two different directions. The plurality of device structures may be integrated in a same electronic device. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure. The plurality of device structures may be arranged in an array and/or in a two-dimensional pattern.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
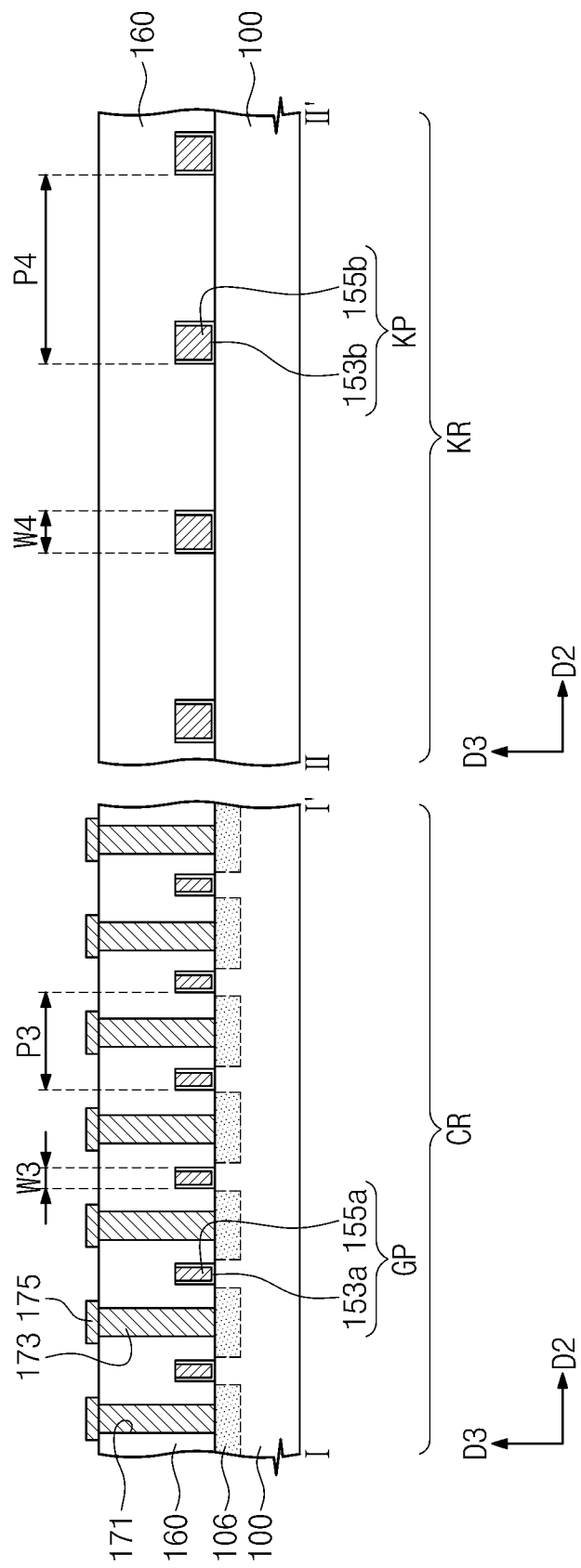
FIG. 2 is a sectional view taken along line I-I' of FIG. 1 to illustrate a semiconductor device according to example embodiments of the inventive concepts.

FIG. 1 is a plan view illustrating a semiconductor device according to example embodiments of the inventive concepts. FIG. 2 is a sectional view taken along line I-I' of FIG. 1 to illustrate a semiconductor device according to example embodiments of the inventive concepts.

Referring to FIGS. 1 and 2, a substrate 100 may be provided. The substrate 100 may be a semiconductor substrate containing silicon, germanium, silicon-germanium or a compound semiconductor substrate. Although not shown, a device isolation pattern (not shown) may be disposed in the substrate 100 to define an active pattern (not shown).

The active pattern may be a portion of the substrate 100 enclosed by the device isolation pattern. In example embodiments, the device isolation pattern may be configured to define a plurality of active patterns. The active pattern may be doped with dopants to have a first conductivity type. The active pattern and the device isolation pattern will be described with reference to example embodiment of the inventive concepts.

The substrate 100 may include a first region CR and a second region KR. The first region CR may be a cell region including field effect transistors, and the second region KR may be a scribe lane region including key patterns KP, which may be used to, for example, monitor alignment and overlay characteristics of contact plugs 173 during the fabrication process of the key patterns KP.

Gate patterns GP and the key patterns KP may be provided in the first region CR and the second region KR, respectively, of the substrate 100. The gate patterns GP and the key patterns KP may be a line shape extending in a first direction D1 parallel to a top surface of the substrate 100. Further, the gate patterns GP and the key patterns KP may be spaced apart from each other in a second direction D2 crossing the first direction D1.

As illustrated in FIG. 2, a pitch P4 of the key patterns KP on the second region KR may be two times a pitch P3 of the gate sacrificial patterns on the first region CR. Widths W4 of the key patterns KP may be 1.5-2 times the widths W3 of the gate patterns GP.

Each one of, or one or more of, the gate patterns GP may include a first conductive line 155a and a gate dielectric layer 153a interposed between the first conductive line 155a and the substrate 100. Each or one or more of the key patterns KP may include a second conductive line 155b and a key dielectric layer 153b interposed between the second conductive line 155b and the substrate 100. The first conductive line 155a and the second conductive line 155b may be formed of or include at least one of metal nitrides (e.g., titanium nitride or tantalum nitride) and metallic materials (e.g., titanium, tantalum, tungsten, copper, or aluminum). The gate dielectric layer 153a and the key dielectric layer 153b may be formed of or include a high-k material. The high-k material may include, for example, at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

Source/drain regions 106 may be formed in the substrate 100 in the first region CR and between the gate patterns GP. The source/drain regions 106 may be doped with dopants to have a second conductivity type that is different from the first conductivity type of the substrate 100. Although not shown, a metal silicide layer may be further provided on each or one or more of the source/drain regions 106. The metal silicide layer may be formed through a reaction between a semiconductor element contained in the source/drain regions 106 and a metallic material provided thereon.

An interlayered insulating layer 160 may be provided on the substrate 100. The interlayered insulating layer 160 may cover the gate patterns GP and the key patterns KP. The interlayered insulating layer 160 may include at least one of a silicon oxide layer, a silicon nitride layer, or a silicon oxynitride layer.

The contact plugs 173 may be provided on the substrate 100 to penetrate the interlayered insulating layer 160 and to be in contact with the source/drain regions 106. When viewed in a plan view, the contact plugs 173 may be provided between the gate patterns GP. The contact plugs 173 may be spaced apart from the gate patterns GP in the second direction D2. The key patterns KP may allow the contact plugs 173 to be aligned and formed on desired positions between the gate patterns GP. As an example, the contact plugs 173 may be formed of or include tungsten. Metal lines 175 may be provided on the contact plugs 173.

FIGS. 3A through 3K are sectional views illustrating a method of fabricating a semiconductor device according to example embodiments of the inventive concepts. FIGS. 3A through 3K are sectional views taken along lines I-I' and II-IT' of FIG. 1.

Figure 3A:
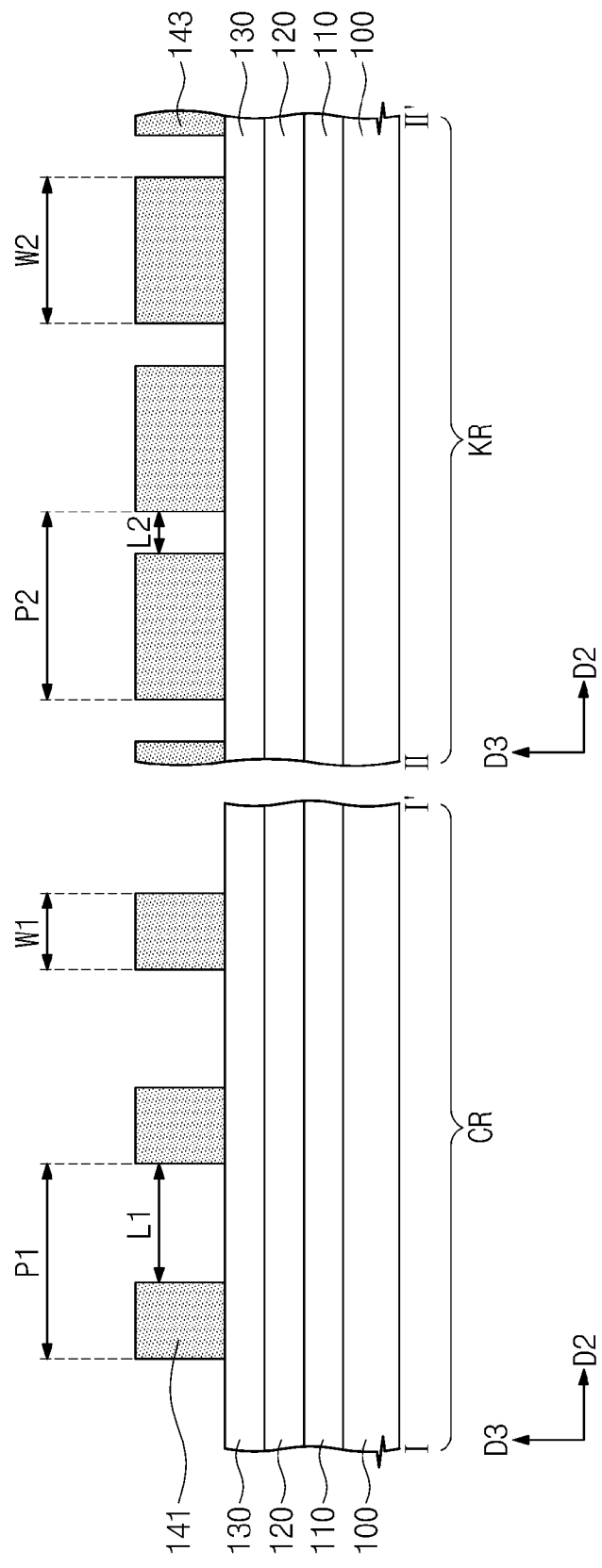

Referring to FIGS. 1 and 3A, a substrate 100 may be provided. The substrate 100 may be a semiconductor substrate containing silicon, germanium, silicon-germanium or a compound semiconductor substrate. For example, a device isolation pattern (not shown) may be formed in the substrate 100 to define an active pattern (not shown). The device isolation pattern may be formed using a shallow trench isolation (STI) process.

The active pattern may be a portion of the substrate 100 enclosed by the device isolation pattern. In example embodiments, the device isolation pattern may be formed to define a plurality of active patterns. The active pattern may be doped with dopants to have a first conductivity type. The active pattern and the device isolation pattern will be described with reference to example embodiments of the inventive concepts.

The substrate 100 may include a first region CR and a second region KR. The first region CR may be a cell region, on which field effect transistors will be formed, and the second region KR may be a scribe lane region, on which key patterns KP will be formed.

A first mold layer 110, a second mold layer 120, and a third mold layer 130 may be sequentially formed on the first region CR and the second region KR of the substrate 100. The first to third mold layers 130 may be formed by a physical vapor deposition (PVD) process, a chemical vapor deposition (CVD) process, or an atomic layer deposition (ALD) process. The first mold layer 110 may be formed of or include at least one of a silicon oxide layer, a silicon nitride layer, or a silicon oxynitride layer. The third mold layer 130 may be formed of or include at least one of a silicon oxide layer, a silicon nitride layer, or a silicon oxynitride layer. The second mold layer 120 may include a material having an etch selectivity with respect to the first and third mold layers 130. As an example, the second mold layer 120 may include a poly silicon layer. The first and third mold layers 110 and 130 may include the same material. For example, both of the first and third mold layers 110 and 130 may include a silicon nitride layer.

First sacrificial patterns 141 and second sacrificial patterns 143 may be formed on the third mold layer 130 (for example, in a simultaneous or contemporaneous manner). The first sacrificial patterns 141 may be formed on the first region CR, and the second sacrificial patterns 143 may be formed on the second region KR. The formation of the first and second sacrificial patterns 141 and 143 may include depositing a sacrificial layer (not shown) on the third mold layer 130, and patterning the sacrificial layer to form the first and second sacrificial patterns 141 and 143. Here, the patterning process may be performed in such a way that different process conditions are applied to the first region CR and the second region KR, respectively. For example, the formation of the first and second sacrificial patterns 141 and 143 may include an exposing step of a photoresist layer, which may be performed to have a difference in an exposed width between the first and second regions CR and KR.

The first and second sacrificial patterns 141 and 143 may be formed to have a line shape extending in a first direction D1 parallel to the top surface of the substrate 100. Here, the first and second sacrificial patterns 141 and 143 may be formed spaced apart from each other in a second direction D2 crossing the first direction D1. For example, an adjacent pair of the first sacrificial patterns 141 may be spaced apart from each other by a distance L1, in the second direction D2. An adjacent pair of the second sacrificial patterns 143 may be spaced apart from each other by a distance L2, in the second direction D2.

A pitch P1 of the first sacrificial patterns 141 on the first region CR may be substantially equal to a pitch P2 of the second sacrificial patterns 143 on the second region KR. However, widths W1 of the first sacrificial patterns 141 may be smaller than widths W2 of the second sacrificial patterns 143. Accordingly, the distance L1 between the adjacent pair of first sacrificial patterns 141 may be greater than the distance L2 between the adjacent pair of second sacrificial patterns 143. Here, the widths W2 of the second sacrificial patterns 143 may be 2-2.5 times the widths W1 of the first sacrificial patterns 141. The first and second sacrificial patterns 141 and 143 may include, for example, a poly silicon layer.

Figure 3B:
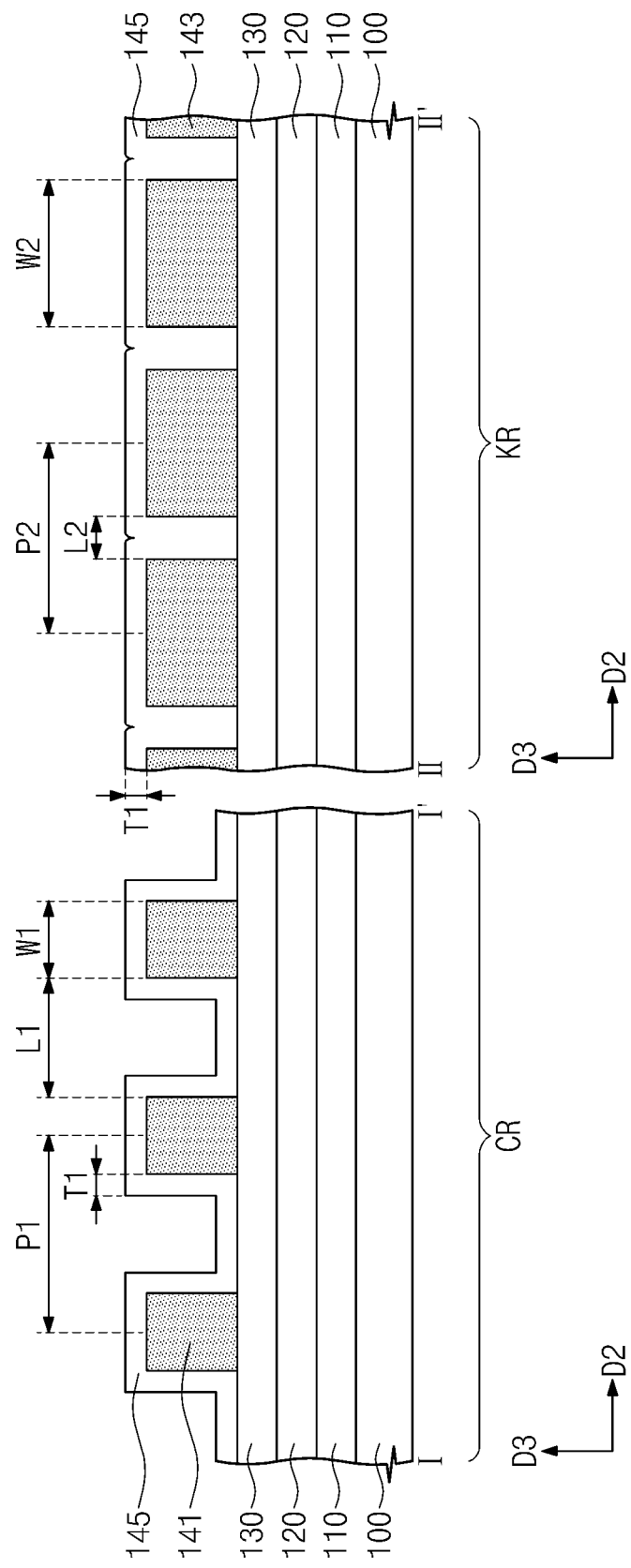

Referring to FIGS. 1 and 3B, a spacer layer 145 may be formed on the first and second regions CR and KR of the substrate 100 to conformally cover the first and second sacrificial patterns 141 and 143. The spacer layer 145 may be formed by a process with a good step coverage property (for example, CVD and ALD processes). Accordingly, the spacer layer 145 may have a uniform deposition thickness T1 on the first and second sacrificial patterns 141 and 143. The spacer layer 145 may include a silicon oxide layer.

In an example embodiment, the distance L2 between the adjacent pair of second sacrificial patterns 143 may be 1.5-2 times the thickness T1 of the spacer layer 145. The distance L1 between the pair of first sacrificial patterns 141 may be greater than two times the thickness T1 of the spacer layer 145. Accordingly, a space between the pair of second sacrificial patterns 143 may be completely filled with the spacer layer 145. By contrast, a space between the pair of first sacrificial patterns 141 may not be completely filled with the spacer layer 145 and the spacer layer 145 may be substantially conformally formed along the surface profile of the first sacrificial pattern 141.

Figure 3C:
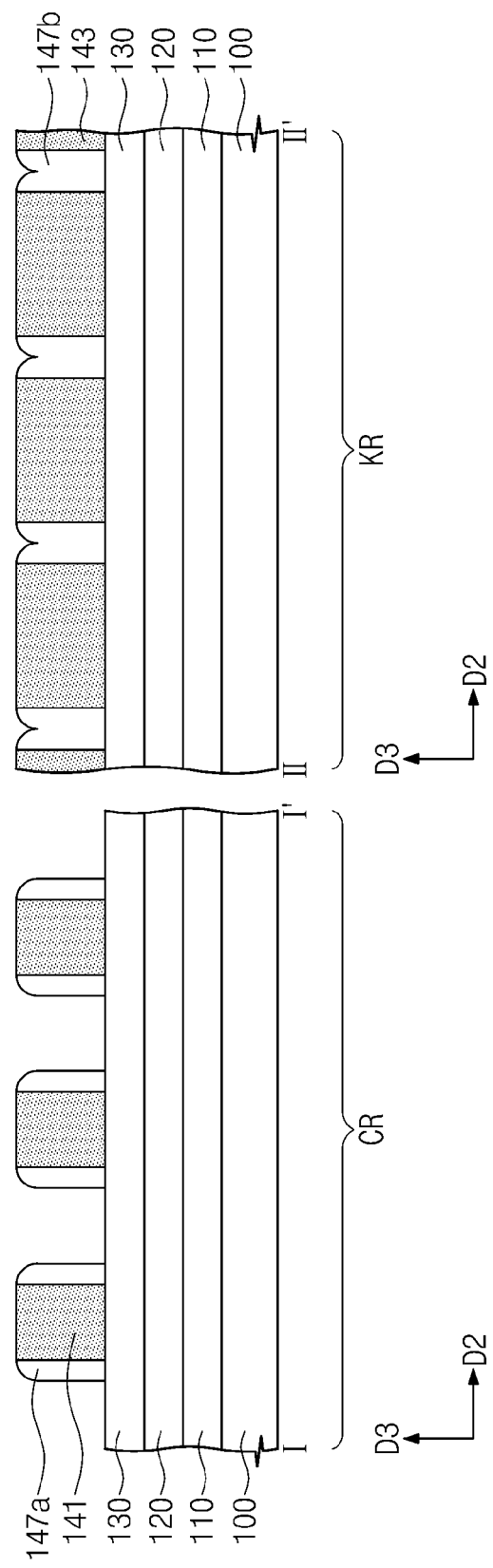

Referring to FIGS. 1 and 3C, the spacer layer 145 may be anisotropically etched to form first spacers 147a covering both sidewalls of the first sacrificial patterns 141 and second spacers 147b covering both sidewalls of the second sacrificial patterns 143. The anisotropic etching process may be performed to expose the top surfaces of the first and second sacrificial patterns 141 and 143 and the top surface of the third mold layer 130.

The first spacers 147a may be shaped like a line extending along the first sacrificial patterns 141. Adjacent ones of the first spacers 147a may be spaced apart from each other in the second direction D2. The second spacers 147b may be shaped like a line extending along the second sacrificial patterns 143. Adjacent ones of the second spacers 147b may be spaced apart from each other in the second direction D2.

The first spacers 147a may be locally formed on both sidewalls of one or more of the first sacrificial patterns 141. The first spacers 147a may be spaced apart from each other in the second direction D2 between the adjacent pair of first sacrificial patterns 141. In other words, a pair of the first spacers 147a may be provided between the adjacent pair of first sacrificial patterns 141. The second spacers 147b may be formed to completely fill the empty space between the adjacent pair of second sacrificial patterns 143. The second spacers 147b may be formed to cover opposite sidewalls of the pair of second sacrificial patterns 143 and the top surface of the third mold layer 130. In other words, the second spacers 147b may be connection spacers disposed between the second sacrificial patterns 143.

As a result of the anisotropic etching process, the maximum width of the first spacers 147a may be substantially the same as the thickness T1 of the spacer layer 145. The maximum width of the second spacers 147b may be substantially the same as the distance L2 between the pair of second sacrificial patterns 143. In other words, the maximum width of the second spacers 147b may be 1.5-2 times the maximum width of the first spacers 147a.

Figure 3D:
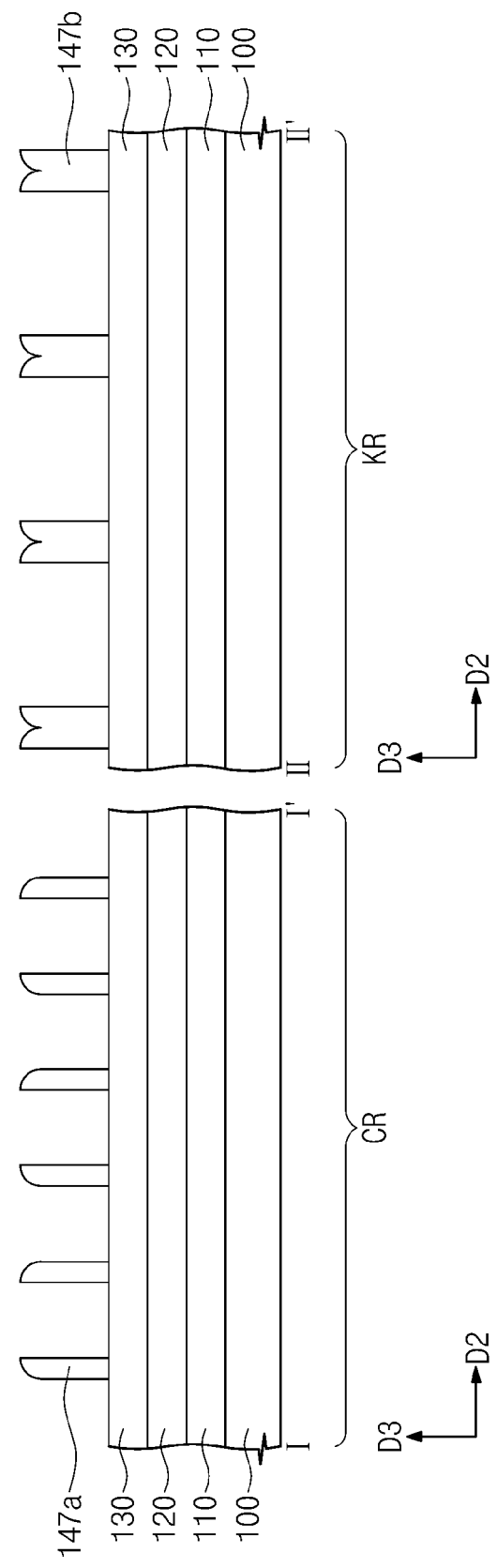

Referring to FIGS. 1 and 3D, the first and second sacrificial patterns 141 and 143 may be selectively removed. The removal of the first and second sacrificial patterns 141 and 143 may be performed using, for example, an ashing and/or stripping process. Here, the first and second spacers 147a and 147b may remain on the third mold layer 130.

Figure 3E:
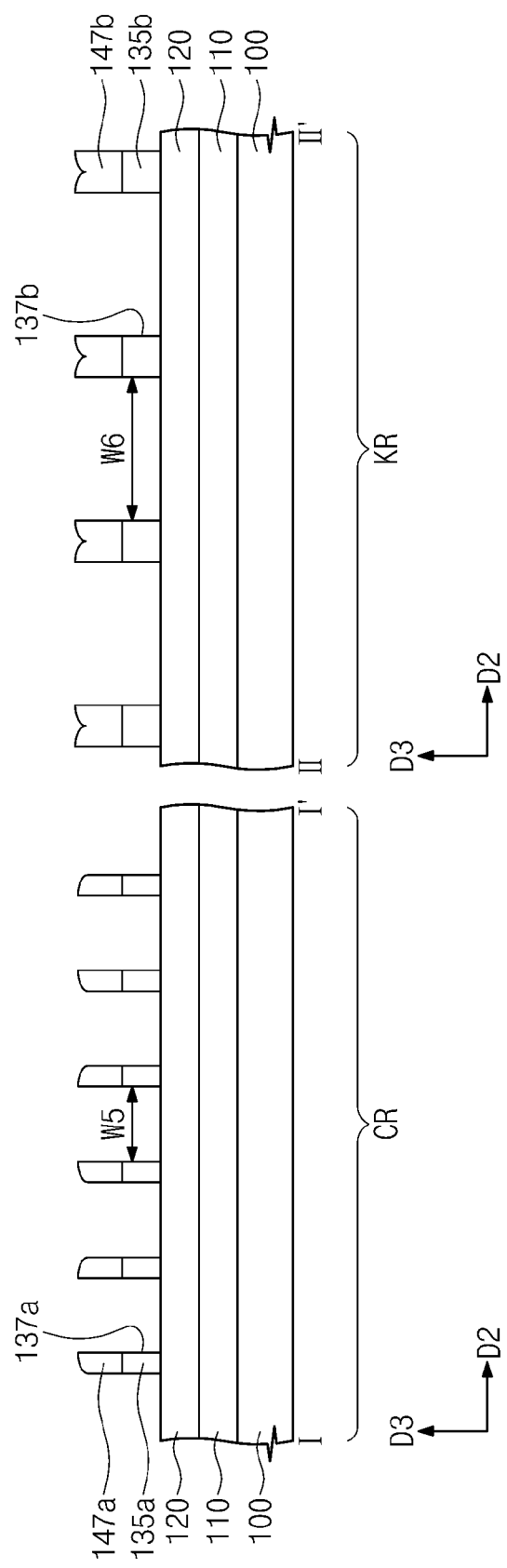

Referring to FIGS. 1 and 3E, the third mold layer 130 may be etched using the first and second spacers 147a and 147b as an etch mask to form first upper mold patterns 135a and second upper mold patterns 135b. The first upper mold patterns 135a may be formed on the first region CR, and the second upper mold patterns 135b may be formed on the second region KR. Accordingly, first preliminary trenches 137a may be formed to expose the top surface of the second mold layer 120 between the first upper mold patterns 135a. Also, second preliminary trenches 137b may be formed to expose the top surface of the second mold layer 120 between the second upper mold patterns 135b. The first and second spacers 147a and 147b may partially remain on the first and second upper mold patterns 135a and 135b.

When viewed in a plan view, the first upper mold patterns 135a may have a shape corresponding to the shape of the first spacers 147a. In other words, the first upper mold patterns 135a may be shaped like a line extending in the first direction D1. Adjacent first upper mold patterns 135a may be spaced apart from each other in the second direction D2. When viewed in a plan view, the second upper mold patterns 135b may have a shape corresponding to that of the second spacers 147b. In other words, the second upper mold patterns 135b may be shaped like a line extending in the first direction D1. Adjacent second upper mold patterns 135b may be spaced apart from each other in the second direction D2.

The first and second preliminary trenches 137a and 137b may extend in a direction parallel to the first direction D1. Widths W5 of the first preliminary trenches 137a may correspond to the widths W1 of the first sacrificial patterns 141. Widths W6 of the second preliminary trenches 137b may correspond to the widths W2 of the second sacrificial patterns 143.

Figure 3F:
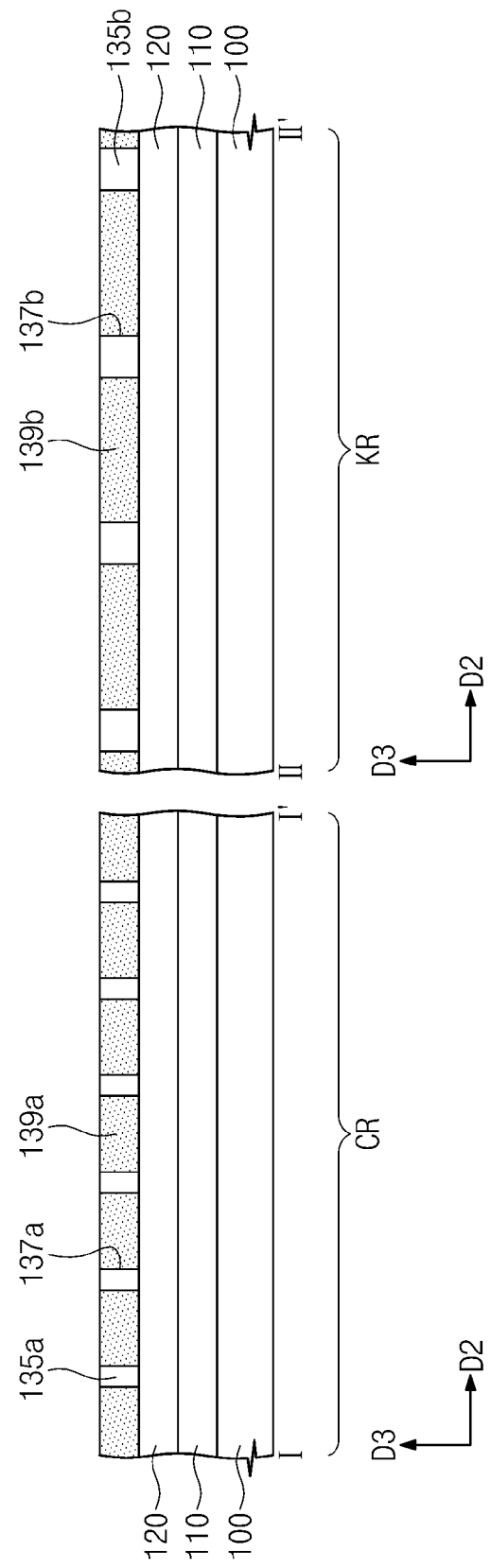

Referring to FIGS. 1 and 3F, first and second mask patterns 139a and 139b may be formed in the first and second preliminary trenches 137a and 137b, respectively. Firstly, the remaining portions of the first and second spacers 147a and 147b may be removed. The removal of the first and second spacers 147a and 147b may be performed using an etching condition providing an etch selectivity with respect to the first mold layer 110 and the second mold layer 120. As an example, the removal of the first and second spacers 147a and 147b may be performed using a wet etching process.

Thereafter, a mask layer (not shown) may be formed on the second mold layer 120 to cover the first and second upper mold patterns 135a and 135b. The mask layer may include a silicon oxide layer. Thereafter, a planarization process may be performed on the mask layer to expose top surfaces of the first and second upper mold patterns 135a and 135b. As a result, the first mask patterns 139a may be formed to fill the first preliminary trenches 137a, and the second mask patterns 139b may be formed to fill the second preliminary trenches 137b.

In other example embodiments, the mask layer (not shown) may be formed to cover all of the first and second spacers 147a and 147b. Thereafter, a planarization process may be performed on the mask layer to expose the top surfaces of the first and second upper mold patterns 135a and 135b. Here, the first and second spacers 147a and 147b may be removed.

Referring to FIGS. 1 and 3G, the first and second upper mold patterns 135a and 135b may be removed. The removal of the first and second upper mold patterns 135a and 135b may be performed using an etching condition providing an etch selectivity with respect to the first and second mask patterns 139a and 139b and the second mold layer 120. As an example, the removal of the first and second upper mold patterns 135a and 135b may be performed using a wet etching process.

First trenches 127a may be formed to expose the top surface of the second mold layer 120 between the first mask patterns 139a. Second trenches 127b may be formed to expose the top surface of the second mold layer 120 between the second mask patterns 139b.

Thereafter, the second mold layer 120 may be etched using the first and second mask patterns 139a and 139b as an etch mask to form first mold mask patterns and second mold mask patterns. The first mold mask patterns 139a may be formed on the first region CR, and the second mold mask patterns 139b may be formed on the second region KR. Accordingly, the first and second trenches 127a and 127b may extend into the second mold layer 120. For example, the first trenches 127a may be formed to expose the top surface of the first mold layer 110 between the first mold mask patterns, and the second trenches 127b may be formed to expose the top surface of the first mold layer 110 between the second mold mask patterns.

Referring to FIGS. 1 and 3H, the first and second mask patterns 139a and 139b may be removed. The removal of the first and second mask patterns 139a and 139b may be performed using an etching condition providing an etch selectivity with respect to the first and second mold mask patterns 125a and 125b and the first mold layer 110. As an example, the removal of the first and second mask patterns 139a and 139b may be performed using a wet etching process.

Thereafter, the first mold layer 110 may be etched using the first and second mold mask patterns 125a and 125b as an etch mask to form first lower mold patterns 115a and second lower mold patterns 115b. The first lower mold patterns 115a may be formed on the first region CR, and the second lower mold patterns 115b may be formed on the second region KR. Accordingly, the first and second trenches 127a and 127b may extend into the first mold layer 110. For example, the first trenches 127a may be formed to expose the top surface of the substrate 100 between the first lower mold patterns 115a, and the second trenches 127b may be formed to expose the top surface of the substrate 100 between the second lower mold patterns 115b.

When viewed in a plan view, the first trenches 127a may have a shape corresponding to the shape of the first spacers 147a. In other words, when viewed in a plan view, the first trenches 127a may be superimposed on the first spacers 147a. A width L3 of the first trenches 127a may be substantially the same as that of the first spacers 147a. When viewed in a plan view, the second trenches 127b may also have a shape corresponding to the shape of the second spacers 147b. In other words, the second trenches 127b may be superimposed on the positions of the second spacers 147b. A width L4 of the second trenches 127b may be substantially the same as the width of the second spacers 147b.

In other example embodiments, the first mold layer 110 may be etched using the first and second mask patterns 139a and 139b and the first and second mold mask patterns 125a and 125b as an etch mask. The first and second mask patterns 139a and 139b may be removed during the etching of the first mold layer 110.

Referring to FIGS. 1 and 3I, gate patterns GP may be formed in the first trenches 127a and key patterns KP may be formed in the second trenches 127b. Firstly, the first and second mold mask patterns 125a and 125b may be removed. The removal of the first and second mold mask patterns 125a and 125b may be performed using an etching condition providing an etch selectivity with respect to the first and second lower mold patterns 115a and 115b and the substrate 100. As an example, the removal of the first and second mold mask patterns 125a and 125b may be performed using a wet etching process.

A dielectric layer (not shown) may be conformally formed on the substrate 100. The dielectric layer may be formed not to completely fill the first and second trenches 127a and 127b. The dielectric layer may be formed to cover bottom surfaces of the first and second trenches 127a and 127b, and moreover, may extend to cover side and top surfaces of the first and second lower mold patterns 115a and 115b. The dielectric layer may be formed using an atomic layer deposition or chemical oxidation process. The dielectric layer may be formed of or include, for example, a high-k material. The high-k material may include, for example, at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

Thereafter, a conductive layer (not shown) may be formed on the dielectric layer to fill the first and second trenches 127a and 127b. The conductive layer may include at least one of metal nitrides (e.g., titanium nitride or tantalum nitride) or metallic materials (e.g., titanium, tantalum, tungsten, copper, or aluminum). The conductive layer may be formed using a deposition process (e.g., CVD or sputtering process).

A planarization process may be performed on the conductive layer to form the gate patterns GP and the key patterns KP in the first and second trenches 127a and 127b, respectively. For example, the conductive layer and the dielectric layer may be planarized until the top surfaces of the first and second lower mold patterns 115a and 115b are exposed. Accordingly, one or more of the gate patterns GP may include a first conductive line 155a and a gate dielectric layer 153a interposed between the first conductive line 155a and the substrate 100. One or more of the key patterns KP may include a second conductive line 155b and a key dielectric layer 153b interposed between the second conductive line 155b and the substrate 100.

In other example embodiments, the dielectric layer and the conductive layer may be formed to cover both of the first and second mold mask patterns 125a and 125b. Thereafter, a planarization process may be performed on the conductive and dielectric layers to expose the top surfaces of the first and second lower mold patterns 115a and 115b. Here, the first and second mold mask patterns 125a and 125b may be removed.

When viewed in a plan view, the gate patterns GP may have a shape corresponding to the shape of the first spacers 147a. In other words, the gate patterns GP may be shaped like a line extending in the first direction D1. Adjacent gate patterns GP may be spaced apart from each other in the second direction D2. The widths W3 of the gate patterns GP may correspond, or be substantially equal, to the widths of the first spacers 147a. When viewed in a plan view, the key patterns KP may have a shape corresponding to the shape of the second spacers 147b. In other words, the key patterns KP may be shaped like a line extending in the first direction D1. Adjacent key patterns KP may be spaced apart from each other in the second direction D2. The widths W4 of the key patterns KP may correspond to the widths of the second spacers 147b. The widths W4 of the key patterns KP may correspond to the distance L2 between the pair of second sacrificial patterns 143.

According to example embodiments of the inventive concepts, the second trenches 127b may be formed to have a width larger than the width of the first trenches 127a, and thus, the second trenches 127b can be easily filled with the conductive layer. This makes it possible to reduce or substantially prevent defects, such as a void, from being formed in the key patterns KP. Further, since the key patterns KP have a relatively large width, it is possible to reduce or substantially suppress a leaning or collapse issue of the key patterns KP.

Referring to FIGS. 1 and 3J, the first and second lower mold patterns 115a and 115b may be removed, and an interlayered insulating layer 160 may be formed to cover the gate patterns GP and the key patterns KP. The removal of the first and second lower mold patterns 115a and 115b may be performed using an etching condition providing an etch selectivity with respect to the gate patterns GP, the key patterns KP and the substrate 100. As an example, the removal of the first and second lower mold patterns 115a and 115b may be performed using a wet etching process.

Source/drain regions 106 may be formed in the substrate 100 between the gate patterns GP, after the removal of the first and second lower mold patterns 115a and 115b and before the formation of the interlayered insulating layer 160. The source/drain regions 106 may be doped with dopants having a second conductivity type that is different from the first conductivity type of the substrate 100. The source/drain regions 106 may not be formed in the second region KR. Although not shown, a metal silicide layer may be further formed on one or more of the source/drain regions 106. The metal silicide layer may be formed through a reaction between a semiconductor element contained in the source/drain regions 106 with a metallic material provided thereon.

The interlayered insulating layer 160 may be formed by a physical vapor deposition (PVD) process, a chemical vapor deposition (CVD) process, or an atomic layer deposition (ALD) process. The interlayered insulating layer 160 may include at least one of a silicon oxide layer, a silicon nitride layer, or a silicon oxynitride layer.

Referring to FIGS. 1 and 3K, on the interlayered insulating layer 160 of the first region CR, hardmask patterns HP and photoresist patterns PP may be formed to have openings OP. When viewed in a plan view, the openings OP may be aligned to be overlapped with the source/drain regions 106.

For example, a hard mask layer and a photoresist layer may be formed on the interlayered insulating layer 160 of the first region CR. Thereafter, a reticle EA may be aligned with respect to the substrate 100. For example, the reticle EA may include an exposing part 220 for an exposure process and an aligning part 210 for aligning the exposing part 220. The exposing part 220 may include a plurality of blocking parts 225 and a plurality of opening parts 223. In an alignment step, the aligning part 210 may be used to adjust positions of the exposing part 220 relative to those of the key patterns KP, and this makes it possible to properly perform an exposure step on desired regions between the gate patterns GP. Here, an image-based or diffraction-based alignment technology may be used to monitor positions of the key patterns KP and perform the alignment on the exposing part 220. Since, as described above, it is possible to reduce or substantially prevent a void or leaning issue from occurring in the key patterns KP, the aligning part 210 can be used to properly perform the monitoring and alignment on the key patterns KP.

If the aligning of the exposing part 220 is finished, a photolithography process may be performed to expose regions of the photoresist layer which are positioned between the gate patterns GP in a plan view. Accordingly, the photoresist patterns PP may be developed. The hard mask layer may be etched using the photoresist patterns PP as an etch mask to form the hardmask patterns HP with the openings OP.

Referring back to FIGS. 1 and 2, the interlayered insulating layer 160 may be etched using the hardmask patterns HP as an etch mask to form contact holes 171 exposing the source/drain regions 106. The photoresist patterns PP and the hardmask patterns HP may be removed. By using the key patterns KP in an exposing and aligning process, it is possible to reduce or substantially prevent the exposure of the gate patterns GP through the contact holes 171, when the contact holes 171 are formed.

Contact plugs 173 may be formed by filling the contact holes 171 with a conductive material. The contact plugs 173 may be formed between the gate patterns GP. Further, the contact plugs 173 may be coupled to the source/drain regions 106, respectively. The contact plugs 173 may be formed of or include tungsten. Metal lines 175 may be formed on the contact plugs 173.

According to example embodiments of the inventive concepts, the key patterns KP and the gate patterns GP may be simultaneously or contemporaneously formed using the same process. Here, the second sacrificial patterns 143 may be formed to have a larger width than the first sacrificial patterns 141 (i.e., W2>W1), and thus, even if there is no change in thickness of the spacer layer 145, it is possible to form the key patterns KP having widths W4 that are greater than the widths W3 of the gate patterns GP. Further, since the key patterns KP have large widths, it is possible to reduce or substantially prevent process failures, such as void in or leaning of the key patterns KP, from occurring in a process of forming the key patterns KP. The use of the key patterns KP may make it possible to reduce a misreading issue, when the key patterns KP are read through the aligning part 210. In particular, since an exposure process for forming the contact holes 171 needs very high alignment accuracy, the key patterns KP serving as the reference for the alignment can be effectively used in the process for forming the contact holes 171.

Figure 4:
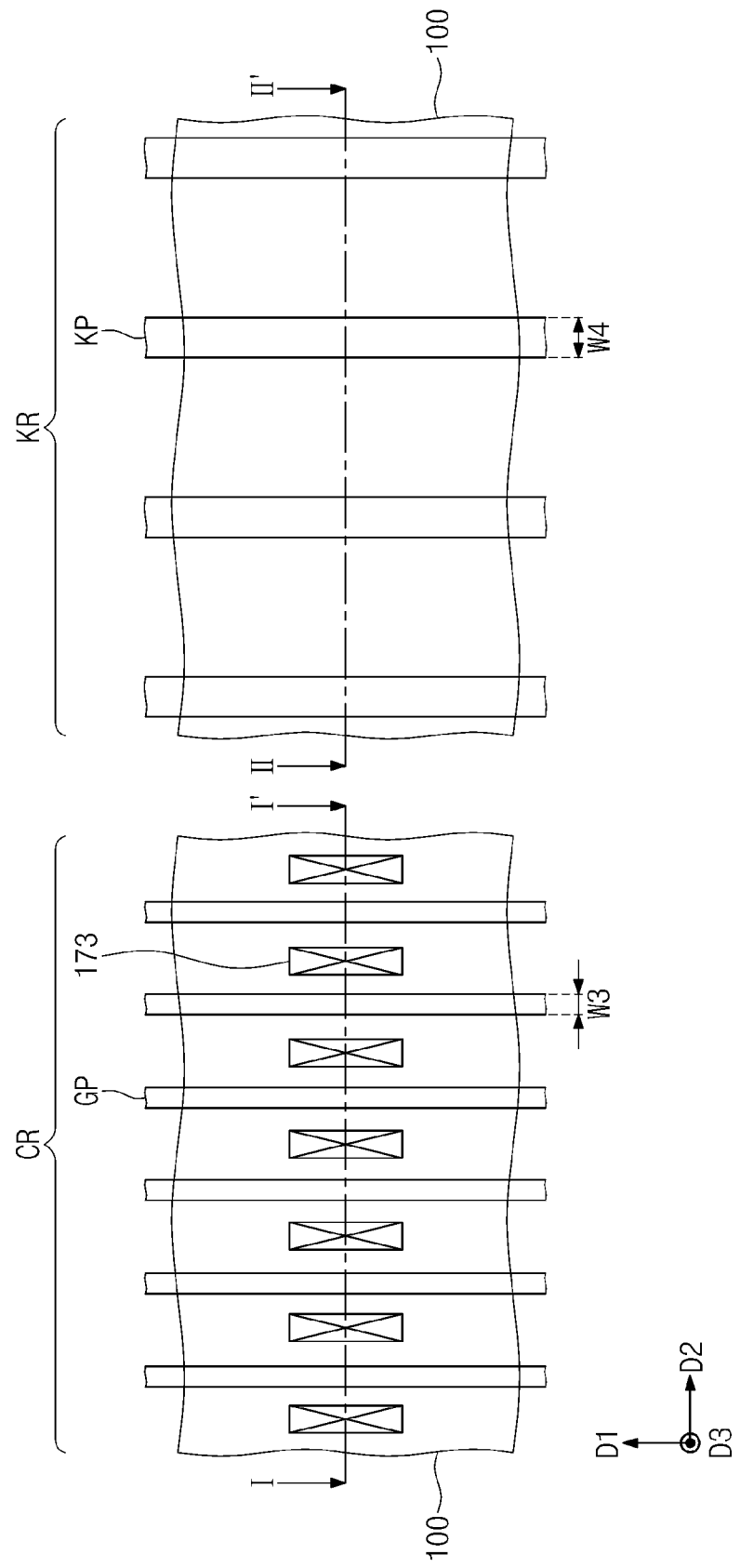
FIG. 4 is a plan view illustrating a semiconductor device according to other example embodiments of the inventive concepts.
Figure 5:
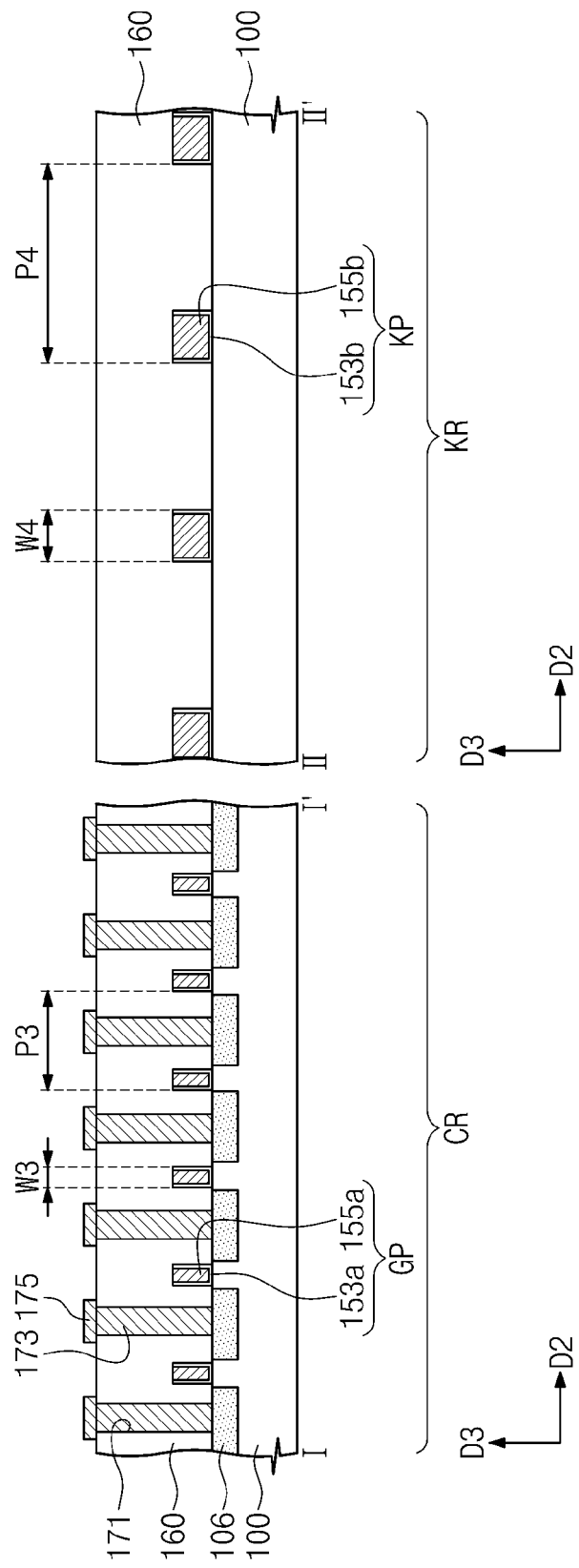
FIG. 5 is a sectional view taken along line I-I' of FIG. 1 to illustrate a semiconductor device according to other example embodiments of the inventive concepts.

FIG. 4 is a plan view illustrating a semiconductor device according to other example embodiments of the inventive concepts. FIG. 5 is a sectional view taken along line I-I' of FIG. 1 to illustrate a semiconductor device according to other example embodiments of the inventive concepts. For concise description, an element previously described with reference to FIGS. 1 and 2 may be identified by a similar or identical reference number without repeating an overlapping description thereof.

A pitch P4 of key patterns KP on the second region KR may be two times a pitch P3 of gate sacrificial patterns on the first region CR. Here, the widths W4 of the key patterns KP may be 2-2.5 times the widths W3 of the gate patterns GP. In other words, the widths W4 of the key patterns KP may be greater than the widths of the key patterns KP described with reference to FIGS. 1 and 2.

Except for these differences, the semiconductor device of the example embodiment may be configured to have substantially the same features as the features described with reference to FIGS. 1 and 2.

FIGS. 6A through 6F are sectional views illustrating a method of fabricating a semiconductor device according to other example embodiments of the inventive concepts. FIGS. 6A through 6F are sectional views taken along lines I-I' and II-II' of FIG. 4. For concise description, an element or step previously described with reference to FIGS. 3A through 3K may be identified by a similar or identical reference number without repeating an overlapping description thereof.

Figure 6A:
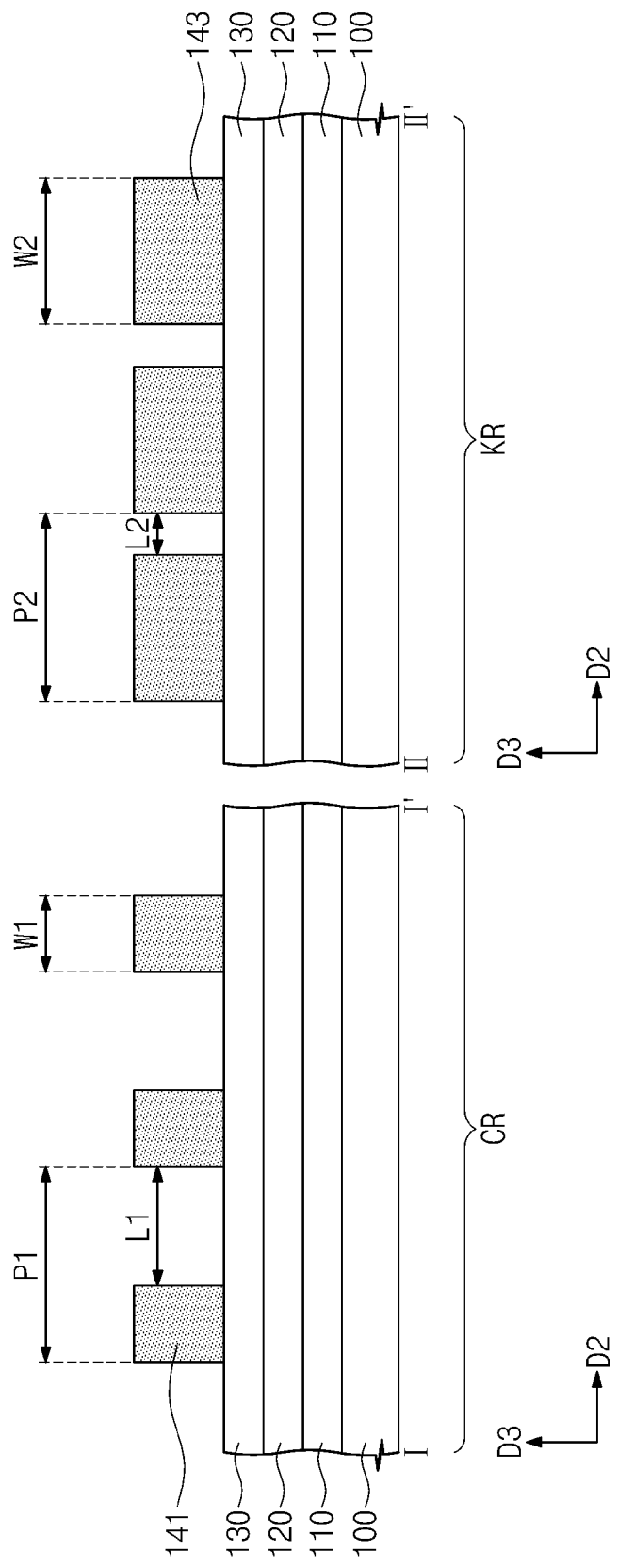
FIGS. 6A through 6F are sectional views illustrating a method of fabricating a semiconductor device according to other example embodiments of the inventive concepts.

Referring to FIGS. 4 and 6A, a substrate 100 may be provided. A first mold layer 110, a second mold layer 120, and a third mold layer 130 may be sequentially formed on the first and second regions CR and KR of the substrate 100. First sacrificial patterns 141 and second sacrificial patterns 143 may be formed on the third mold layer 130 (for example, in a simultaneous manner).

A pitch P1 of the first sacrificial patterns 141 on the first region CR may be substantially the same as the pitch P2 of the second sacrificial patterns 143 on the second region KR. However, widths W1 of the first sacrificial patterns 141 may be smaller than widths W2 of the second sacrificial patterns 143. Accordingly, the distance L1 between the adjacent pair of first sacrificial patterns 141 may be greater than the distance L2 between the adjacent pair of second sacrificial patterns 143. Here, the widths W2 of the second sacrificial patterns 143 may be 1.5-2 times the widths W1 of the first sacrificial patterns 141. In other words, the widths W2 of the second sacrificial patterns 143 may be smaller than that of the previous embodiments of FIGS. 1 and 3A. Accordingly, the distance L2 between the pair of second sacrificial patterns 143 may be greater than the distance between the pair of second sacrificial patterns 143 described with reference to FIGS. 1 and 3A.

Figure 6B:
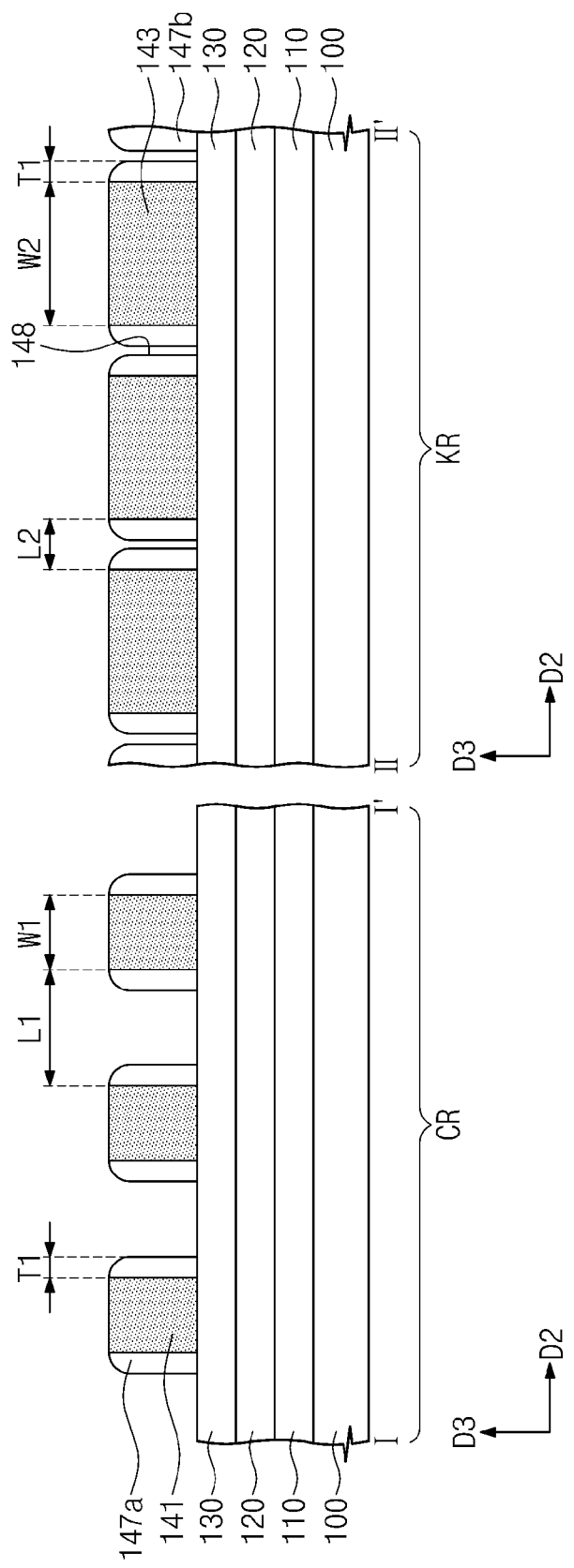

Referring to FIGS. 4 and 6B, a spacer layer (not shown) may be formed on the first and second regions CR and KR of the substrate 100 to conformally substantially cover the first and second sacrificial patterns 141 and 143. Thereafter, the spacer layer may be anisotropically etched to form first spacers 147a covering both sidewalls of the first sacrificial patterns 141 and second spacers 147b covering both sidewalls of the second sacrificial patterns 143.

The first spacers 147a may be locally formed on both sidewalls of one or more of the first sacrificial patterns 141. The first spacers 147a may be spaced apart from each other in the second direction D2 between the adjacent pair of first sacrificial patterns 141. In other words, a pair of the first spacers 147a may be provided between the adjacent pair of first sacrificial patterns 141.

Similarly to the first spacers 147a, the second spacers 147b may be locally formed on both sidewalls of one or more of the second sacrificial patterns 143. The second spacers 147b may be spaced apart from each other, thereby forming an empty space 148 between the adjacent pair of second sacrificial patterns 143. This is because the distance L2 between the pair of second sacrificial patterns 143 is 2-2.5 times the thickness T1 of the first and second spacers 147b, and consequently, the space between the pair of second sacrificial patterns 143 is not completely filled with the second spacers 147b. For example, the empty spaces 148 may be formed to have a maximum width of 10 nm or less.

Figure 6C:
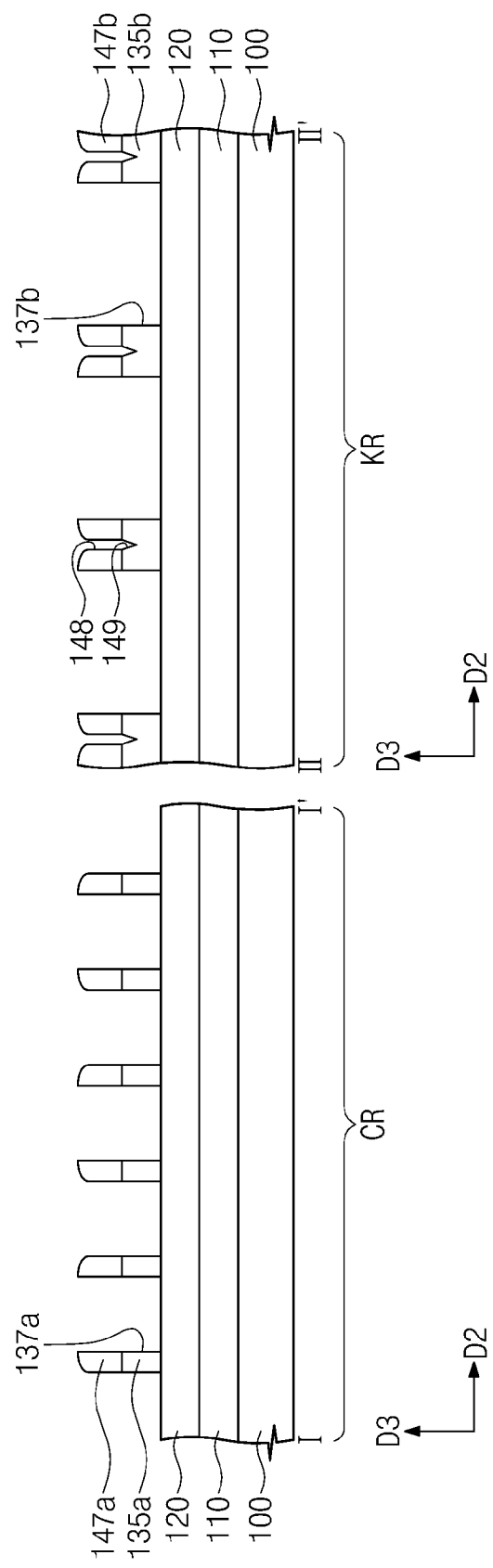

Referring to FIGS. 4 and 6C, the first and second sacrificial patterns 141 and 143 may be selectively removed. Thereafter, the third mold layer 130 may be etched using the first and second spacers 147a and 147b as an etch mask to form first upper mold patterns 135a and second upper mold patterns 135b.

As a result of the formation of the first and second upper mold patterns 135a and 135b, first preliminary trenches 137a may be formed to expose the top surface of the second mold layer 120 between the first upper mold patterns 135a. Also, second preliminary trenches 137b may be formed to expose the top surface of the second mold layer 120 between the second upper mold patterns 135b.

Meanwhile, when the second preliminary trenches 137b are formed, grooves 149 extending from the empty spaces 148 toward the substrate 100 may be formed in the second upper mold patterns 135b. Here, bottom surfaces of the grooves 149 may be positioned at substantially the same level as or a higher level than those of the bottom surfaces of the second preliminary trenches 137b. In other words, the grooves 149 may be formed not to penetrate the second upper mold patterns 135b. One or more of the empty spaces 148 may have a width of 10 nm or less, which is smaller than the width of the second preliminary trenches 137b. The process of etching the third mold layer 130 may be performed in such a way that the groove 149 has a decreasing width in a direction extending toward the substrate 100. Accordingly, the formation of the grooves 149 may be stopped in upper portions of the second upper mold patterns 135b, when the formation of the second preliminary trenches 137b is finished.

When viewed in a plan view, the first upper mold patterns 135a may have a shape corresponding to the shape of the first spacers 147a. However, when viewed in a plan view, the second upper mold patterns 135b may not have a shape corresponding to the shape of the second spacers 147b. In other words, the widths of the second upper mold patterns 135b may be substantially equal to the distance L2 between the pair of second sacrificial patterns 143.

Figure 6D:
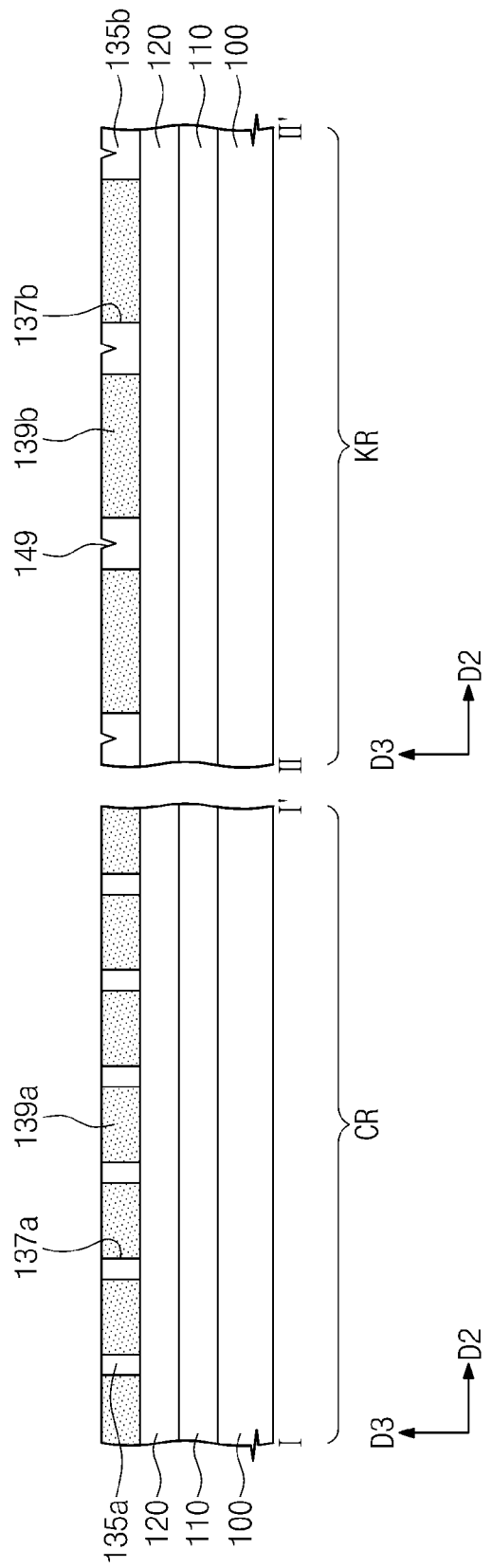

Referring to FIGS. 4 and 6D, first and second mask patterns 139a and 139b may be formed in the first and second preliminary trenches 137a and 137b, respectively. Firstly, the remaining portions of the first and second spacers 147a and 147b may be removed. Thereafter, a mask layer (not shown) may be formed on the second mold layer 120 to cover the first and second upper mold patterns 135a and 135b. Thereafter, a planarization process may be performed on the mask layer to expose top surfaces of the first and second upper mold patterns 135a and 135b. As a result, the first mask patterns 139a may be formed to fill the first preliminary trenches 137a, and the second mask patterns 139b may be formed to fill the second preliminary trenches 137b.

Here, since the grooves 149 are formed to have a very small width, the whole region of the groove 149 may not be filled with the mask layer. Further, although not shown, even if the grooves 149 are completely filled with the mask layer, the mask layer may be removed during a subsequent process for removing the second upper mold patterns 135b.

Figure 6E:
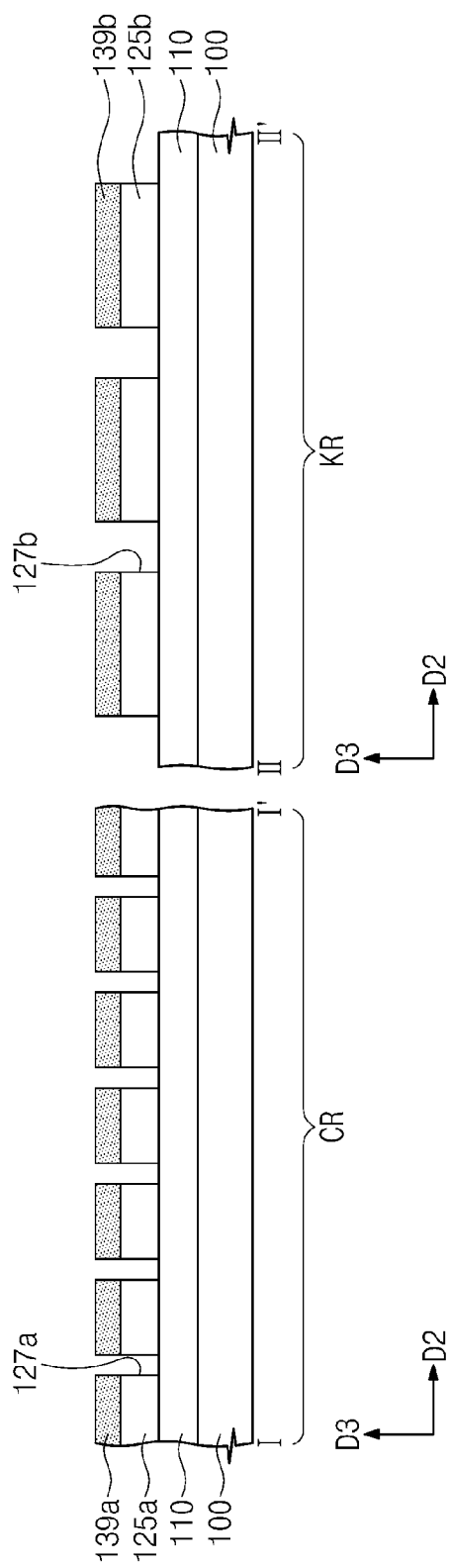

Referring to FIGS. 4 and 6E, the first and second upper mold patterns 135a and 135b may be removed. First trenches 127a may be formed to expose the top surface of the second mold layer 120 between the first mask patterns 139a. Second trenches 127b may be formed to expose the top surface of the second mold layer 120 between the second mask patterns 139b. Thereafter, the second mold layer 120 may be etched using the first and second mask patterns 139a and 139b as an etch mask to form first mold mask patterns and second mold mask patterns. Accordingly, the first and second trenches 127a and 127b may extend into the second mold layer 120.

Figure 6F:
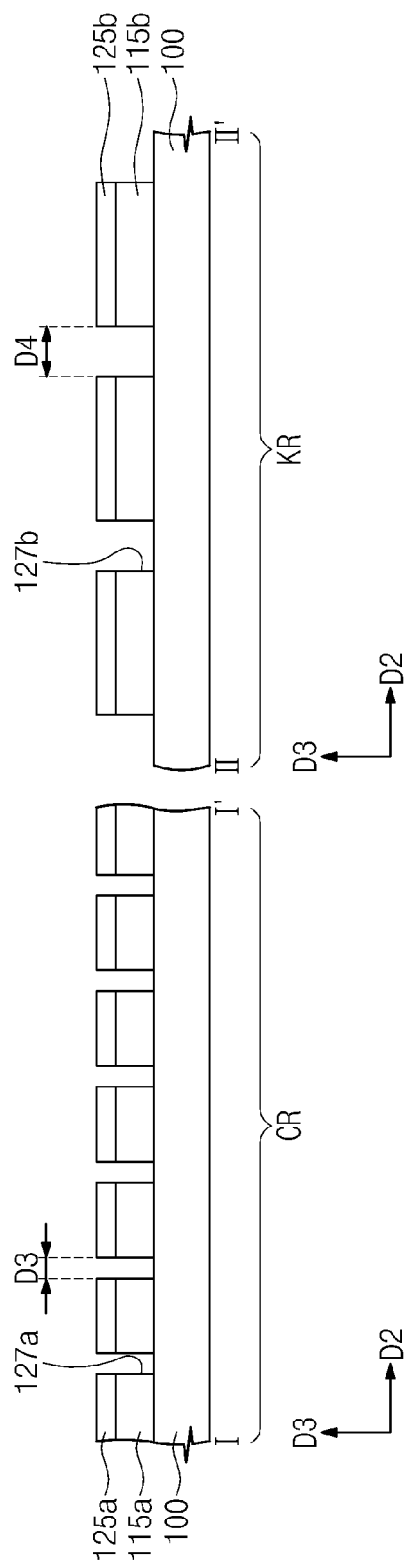

Referring to FIGS. 4 and 6F, the first and second mask patterns 139a and 139b may be removed. Thereafter, the first mold layer 110 may be etched using the first and second mold mask patterns 125a and 125b as an etch mask to form first lower mold patterns 115a and second lower mold patterns 115b. Accordingly, the first and second trenches 127a and 127b may extend into the first mold layer 110.

When viewed in a plan view, the first trenches 127a may have a shape corresponding to the shape of the first spacers 147a. In other words, the widths L3 of the first trenches 127a may be substantially equal to the widths of the first spacers 147a. However, when viewed in a plan view, the second trenches 127b may not have a shape corresponding to the shape of the second spacers 147b. In other words, the widths L4 of the second trenches 127b may be substantially equal to the distance L2 between the pair of second sacrificial patterns 143.

Referring back to FIGS. 4 and 5, the first and second mold mask patterns 125a and 125b may be removed. Thereafter, gate patterns GP may be formed in the first trenches 127a, and key patterns KP may be formed in the second trenches 127b. One or more of the gate patterns GP may include a first conductive line 155a and a gate dielectric layer 153a interposed between the first conductive line 155a and the substrate 100. One or more of the key patterns KP may include a second conductive line 155b and a key dielectric layer 153b interposed between the second conductive line 155b and the substrate 100.

When viewed in a plan view, the gate patterns GP may have a shape corresponding to the shape of the first spacers 147a. However, when viewed in a plan view, the key patterns KP may not have a shape corresponding to the shape of the second spacers 147b. The widths W4 of the key patterns KP may be substantially equal to the distance L2 between the pair of second sacrificial patterns 143. Here, the widths W4 of the key patterns KP may be 2-2.5 times the widths W3 of the gate patterns GP.

The first and second lower mold patterns 115a and 115b may be removed, and source/drain regions 106 may be formed in the substrate 100 positioned between the gate patterns GP. Thereafter, an interlayered insulating layer 160 may be formed to cover the gate patterns GP and the key patterns KP.

A photolithography process may be performed to form contact holes 171 penetrating the interlayered insulating layer 160 and exposing the source/drain regions 106. During the photolithography process, the key patterns KP may be used to align the contact holes 171 between the gate patterns GP, and this process may be performed using the same method as the method described with reference to FIGS. 1 and 3K.

Contact plugs 173 may be formed by filling the contact holes 171 with a conductive material. The contact plugs 173 may be formed between the gate patterns GP. Further, the contact plugs 173 may be coupled to the source/drain regions 106, respectively. Metal lines 175 may be formed on the contact plugs 173.

Figure 8A:
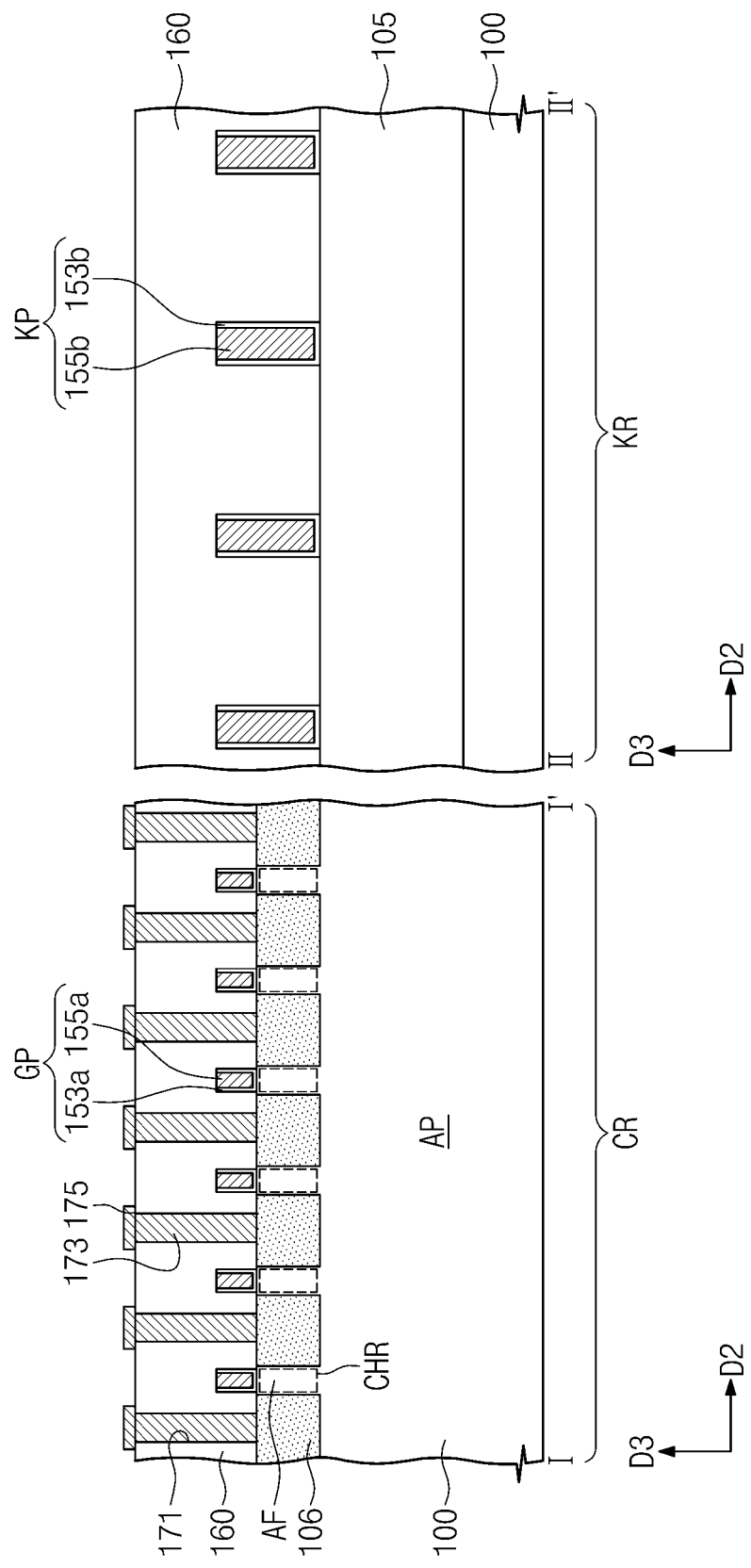
FIGS. 8A and 8B are sectional views illustrating a semiconductor device according to still other example embodiments of the inventive concepts.
Figure 8B:
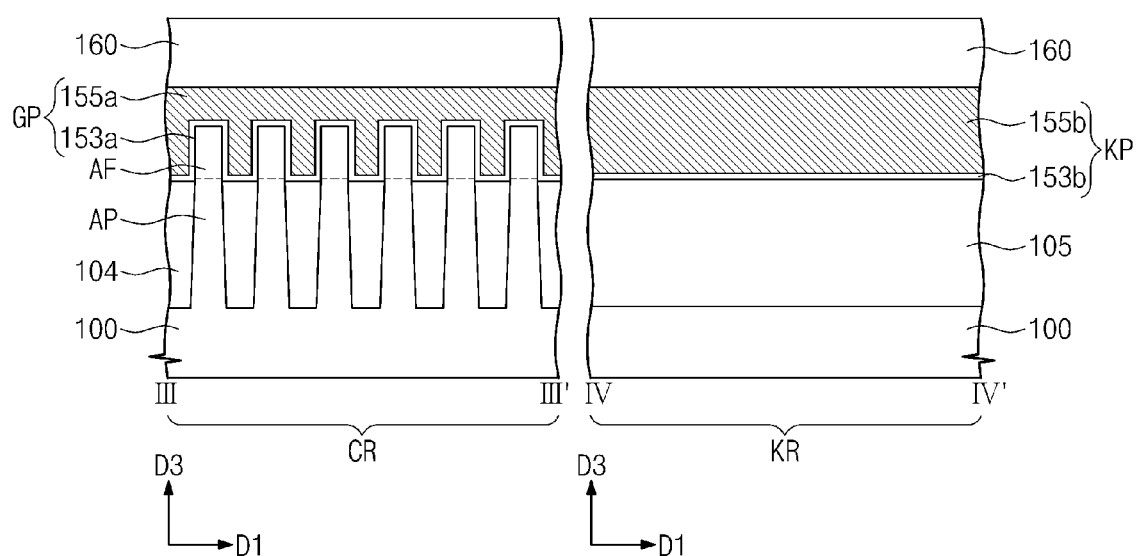

FIG. 7 is a plan view illustrating a semiconductor device according to other example embodiments of the inventive concepts. FIGS. 8A and 8B are sectional views illustrating a semiconductor device according to other example embodiments of the inventive concepts. FIG. 8A is a sectional view taken along lines I-I' and II-II' of FIG. 7, and FIG. 8B is a sectional view taken along lines III-III' and IV-IV' of FIG. 7. For concise description, an element previously described with reference to FIGS. 1 and 2 may be identified by a similar or identical reference number without repeating an overlapping description thereof.

Referring to FIGS. 7, 8A, and 8B, a substrate 100 may be provided. The substrate 100 may include a first region CR and a second region KR. The first region CR may be a cell region provided with field effect transistors, and the second region KR may be a scribe lane region provided with key patterns KP, which may be used to monitor alignment and overlay characteristics of contact plugs 173 during its fabrication process.

Device isolation patterns 104 may be formed in the first region CR of the substrate 100 to define active patterns AP. The device isolation patterns 104 may be formed of or include a silicon oxide layer. The device isolation patterns 104 may be shaped like a line extending in a second direction D2 parallel to the top surface of the substrate 100. The active patterns AP may be line-shaped patterns extending parallel to the second direction D2 or the device isolation patterns 104. The active patterns AP may be spaced apart from each other, by the device isolation patterns 104, in a first direction D1 crossing the second direction D2.

The device isolation patterns 104 may be formed to expose upper portions (hereinafter, active fins AF) of the active patterns AP. The active fins AF may protrude from the active patterns AP in a third direction D3, which is normal to the top surface of the substrate 100. The active fins AF may include channel regions CHR.

An insulating layer 105 may be formed on the second region KR of the substrate 100. The insulating layer 105 and the device isolation patterns 104 may be formed at the same time, for example, using the same process. Accordingly, the insulating layer 105 may have a top surface that is coplanar with the top surface of the device isolation patterns 104. The insulating layer 105 may include a silicon oxide layer.

On the first region CR, gate patterns GP may be disposed to cross the active fins AF. The gate patterns GP may be line-shaped patterns covering top and side surfaces of the active fins AF and extending parallel to the first direction D1. The gate patterns GP may be spaced apart from each other in the second direction D2.

Key patterns KP may be provided on the insulating layer 105 of the second region KR. The key patterns KP may be a line-shaped pattern extending parallel to the first direction D1. The key patterns KP may be spaced apart from each other in the second direction D2.

One or more of the gate patterns GP may include a first conductive line 155a and a gate dielectric layer 153a interposed between the first conductive line 155a and the active fins AF. The gate dielectric layer 153a may extend along a bottom surface of the first conductive line 155a. For example, the gate dielectric layer 153a may be formed to cover the top and sidewalls of the active fins AF. The gate dielectric layer 153a may extend horizontally from the active fins AF and may cover at least a portion of the top surfaces of the device isolation patterns 104. However, the gate dielectric layer 153a may also be formed to expose at least a portion of the top surfaces of the device isolation patterns 104. The exposed top surfaces of the device isolation patterns 104 may be covered with an interlayered insulating layer 160, as will be described below.

One or more of the key patterns KP may include a second conductive line 155b and a key dielectric layer 153b interposed between the second conductive line 155b and the substrate 100. The key dielectric layer 153b may extend along the bottom surface of the second conductive line 155b and may cover a portion of the top surface of the insulating layer 105. Other portion of the top surface of the insulating layer 105, which is not covered with the key dielectric layer 153b, may be covered with the interlayered insulating layer 160.

Source/drain regions 106 may be provided on portions of the active pattern AP positioned at both sides of the gate patterns GP. The source/drain regions 106 may be epitaxially grown from the active pattern AP. Although not shown, when viewed in a sectional view, the active fins AF may be formed to have top surfaces higher than bottom surfaces of the source/drain regions 106. The source/drain regions 106 may be formed to have top surfaces that are positioned at the same level as or a higher level than the active fins AF. When viewed in a sectional view, the channel regions CHR of the active fins AF may be positioned between the source/drain regions 106. Although not shown, a metal silicide layer may be further disposed on one or more of the source/drain regions 106.

The interlayered insulating layer 160 may be provided on the substrate 100. The interlayered insulating layer 160 may cover the gate patterns GP and the key patterns KP. The contact plugs 173 may be provided on the substrate 100 to penetrate the interlayered insulating layer 160 and be in contact with the source/drain regions 106. Metal lines 175 may be provided on the contact plugs 173.

FIGS. 9A through 13A and 9B through 13B are sectional views illustrating a method of fabricating a semiconductor device according to other example embodiments of the inventive concepts. For example, FIGS. 9A through 13A are sectional views taken along lines I-I' and II-II' of FIG. 7, and FIGS. 9B through 13B are sectional views taken along lines III-III' and IV-IV' of FIG. 7. For concise description, an element or step previously described with reference to FIGS. 3A through 3K may be identified by a similar or identical reference number without repeating an overlapping description thereof.

Figure 9B:
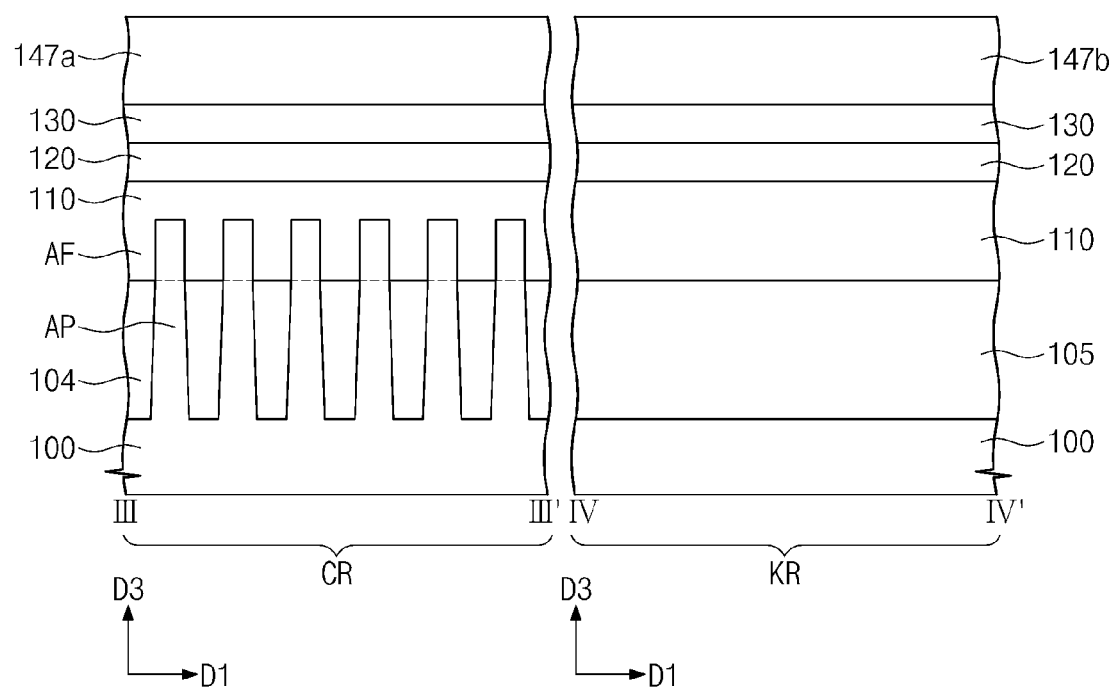

Referring to FIGS. 7, 9A, and 9B, a substrate 100 may include a first region CR and a second region KR. The first region CR may be a cell region provided with field effect transistors, and the second region KR may be a scribe lane region provided with key patterns KP, which may be used to monitor alignment and overlay characteristics of contact plugs 173 during its fabrication process.

Device isolation patterns 104 may be formed in the first region CR of the substrate 100 to define active patterns AP. The device isolation patterns 104 may be formed using, for example, a shallow trench isolation (STI) process. As an example, the device isolation patterns 104 may be formed by forming trenches in the substrate 100 and filling the trenches with an insulating material including silicon oxide. One or more of the trenches may be formed to have an aspect ratio of at least 5. One or more of the trenches may be formed to have a downwardly-tapered profile, and in this case, one or more of the active patterns AP may have an upwardly-tapered profile.

Upper portions (hereinafter, active fins AF) of the active patterns AP may be exposed. The exposing of the active fins AF may include vertically recessing the top surfaces of the device isolation patterns 104 using, for example, a wet etching process. As an example, the active fins AF may be exposed by etching the device isolation patterns 104 using an etch recipe having an etch selectivity with respect to the active patterns AP. The active fins AF may be line-shaped patterns extending parallel to a second direction D2 or the top surface of the substrate. The active fins AF may be spaced apart from each other in a first direction D1 crossing the second direction D2.

In example embodiments, when the device isolation patterns 104 are formed on the first region CR, an insulating layer 105 may be formed on the second region KR of the substrate 100. As an example, during the formation of the trenches on the first region CR, the substrate 100 of the second region KR may be etched to be substantially coplanar with the bottom surfaces of the trenches, and during the filling of the trenches with an insulating material including silicon oxide, the insulating layer 105 may be formed on the second region KR. Accordingly, the insulating layer 105 may have a top surface that is coplanar with the top surface of the device isolation patterns 104.

A first mold layer 110, a second mold layer 120, and a third mold layer 130 may be sequentially formed on the first region CR and the second region KR of the substrate 100. The first mold layer 110 of the first region CR may be formed to wholly cover the active fins AF exposed by the device isolation patterns 104. The first mold layer 110 of the second region KR may be formed to wholly cover the insulating layer 105. The first mold layer 110 of the first region CR may be formed to have a top surface that is substantially coplanar with the top surface of the first mold layer 110 of the second region KR. First sacrificial patterns 141 and second sacrificial patterns 143 may be formed on the third mold layer 130 (for example, in a simultaneous or contemporaneous manner). When viewed in a plan view, the first sacrificial patterns 141 may be formed to extend in a direction parallel to the first direction D1 and cross the active fins AF.

In the example embodiment, widths of, pitches of, and intervals between the first and second sacrificial patterns 141 and 143 may be substantially the same as in previous embodiments described with reference to FIG. 3A or FIG. 6A.

A spacer layer (not shown) may be formed on the first region CR and the second region KR of the substrate 100 to conformally cover the first and second sacrificial patterns 141 and 143. Thereafter, the spacer layer may be anisotropically etched to form first spacers 147a covering both sidewalls of the first sacrificial patterns 141 and second spacers 147b covering both sidewalls of the second sacrificial patterns 143.

The first spacers 147a may be locally formed on both sidewalls of one or more of the first sacrificial patterns 141. The first spacers 147a may be spaced apart from each other in the second direction D2 between the adjacent pair of first sacrificial patterns 141. In other words, a pair of the first spacers 147a may be provided between the adjacent pair of first sacrificial patterns 141.

The second spacers 147b may be formed to cover opposite sidewalls of the pair of second sacrificial patterns 143 and the top surface of the third mold layer 130. In other words, the second spacers 147b may be connection spacers disposed between the second sacrificial patterns 143. The example embodiment refers to an example, in which the second spacers 147b is used as the connection spacers. However, as previously described with reference to FIG. 6B, the second spacers 147b, similarly to the first spacers 147a, may be locally formed on both sidewalls of one or more of the second sacrificial patterns 143. For example, the second spacers 147b may be spaced apart from each other to form a space between the adjacent pair of second sacrificial patterns 143.

Figure 10A:
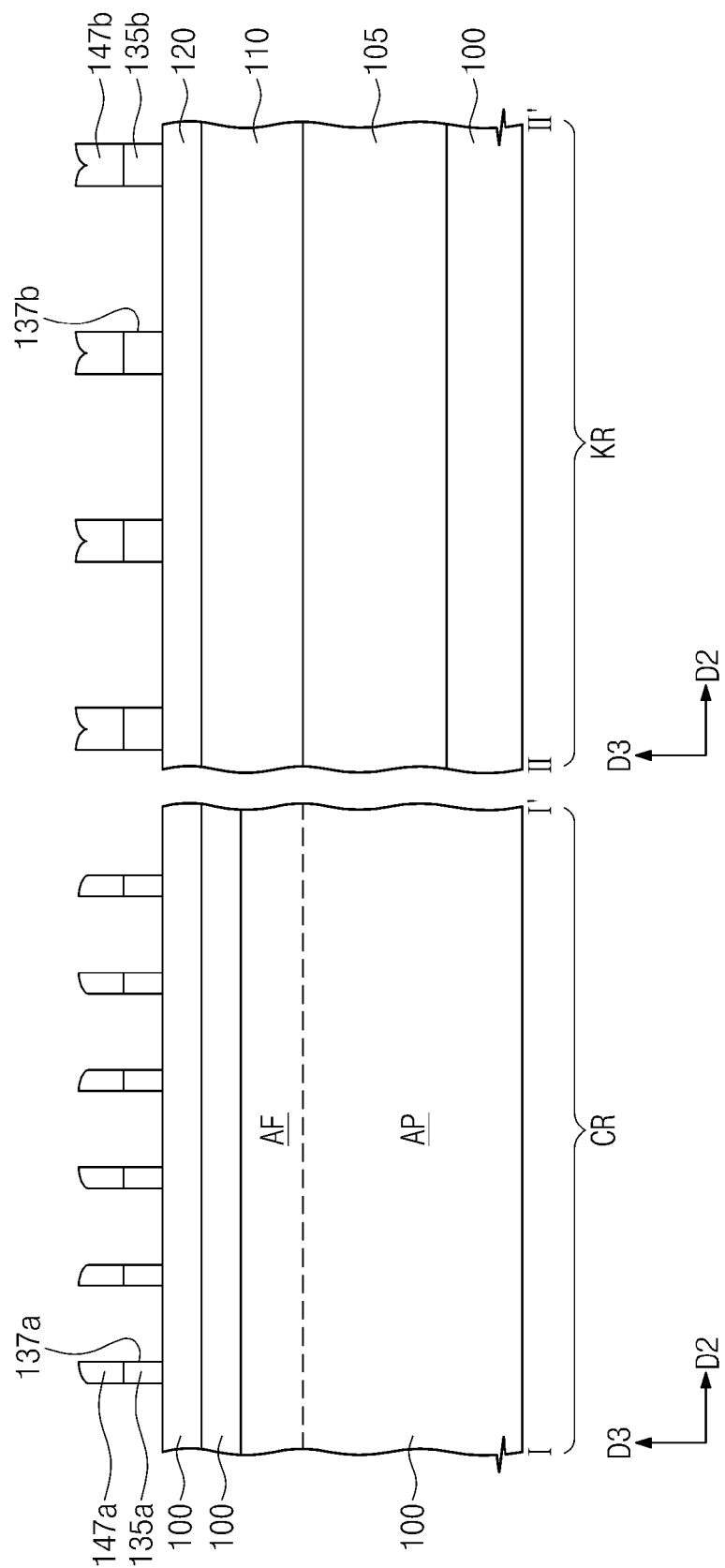
Figure 10B:
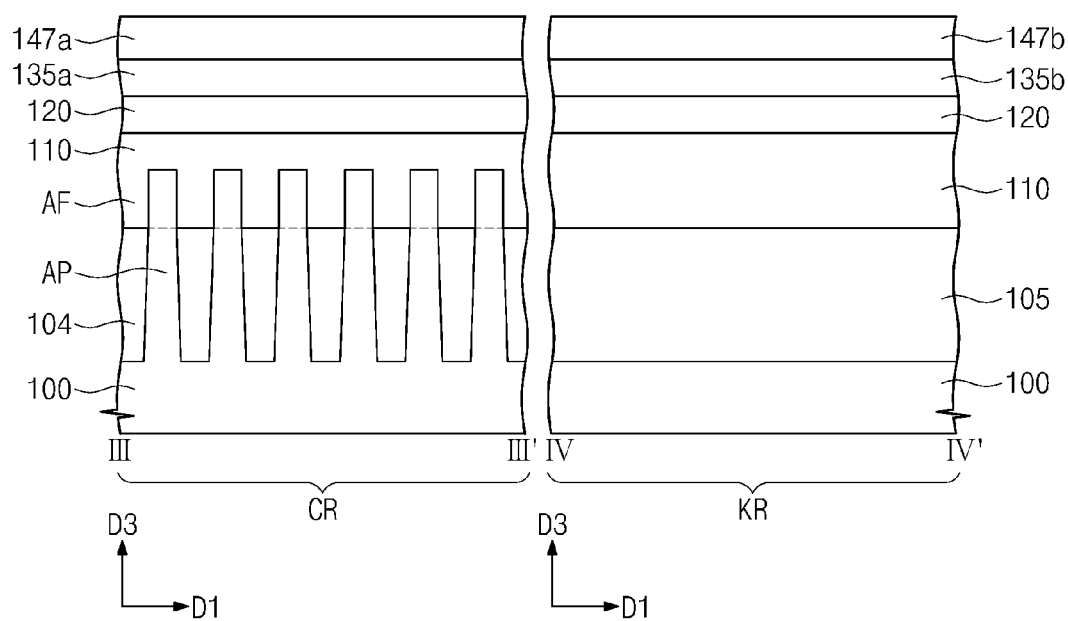

Referring to FIGS. 7, 10A, and 10B, the first and second sacrificial patterns 141 and 143 may be selectively removed. Thereafter, the third mold layer 130 may be etched using the first and second spacers 147a and 147b as an etch mask to form first upper mold patterns 135a and second upper mold patterns 135b. As a result of the formation of the first and second upper mold patterns 135a and 135b, first preliminary trenches 137a may be formed to expose the top surface of the second mold layer 120 between the first upper mold patterns 135a. Also, second preliminary trenches 137b may be formed to expose the top surface of the second mold layer 120 between the second upper mold patterns 135b.

When viewed in a plan view, the first upper mold patterns 135a may have a shape corresponding to the shape of the first spacers 147a. When viewed in a plan view, the second upper mold patterns 135b may have a shape corresponding to the shape of the second spacers 147b.

Figure 11A:
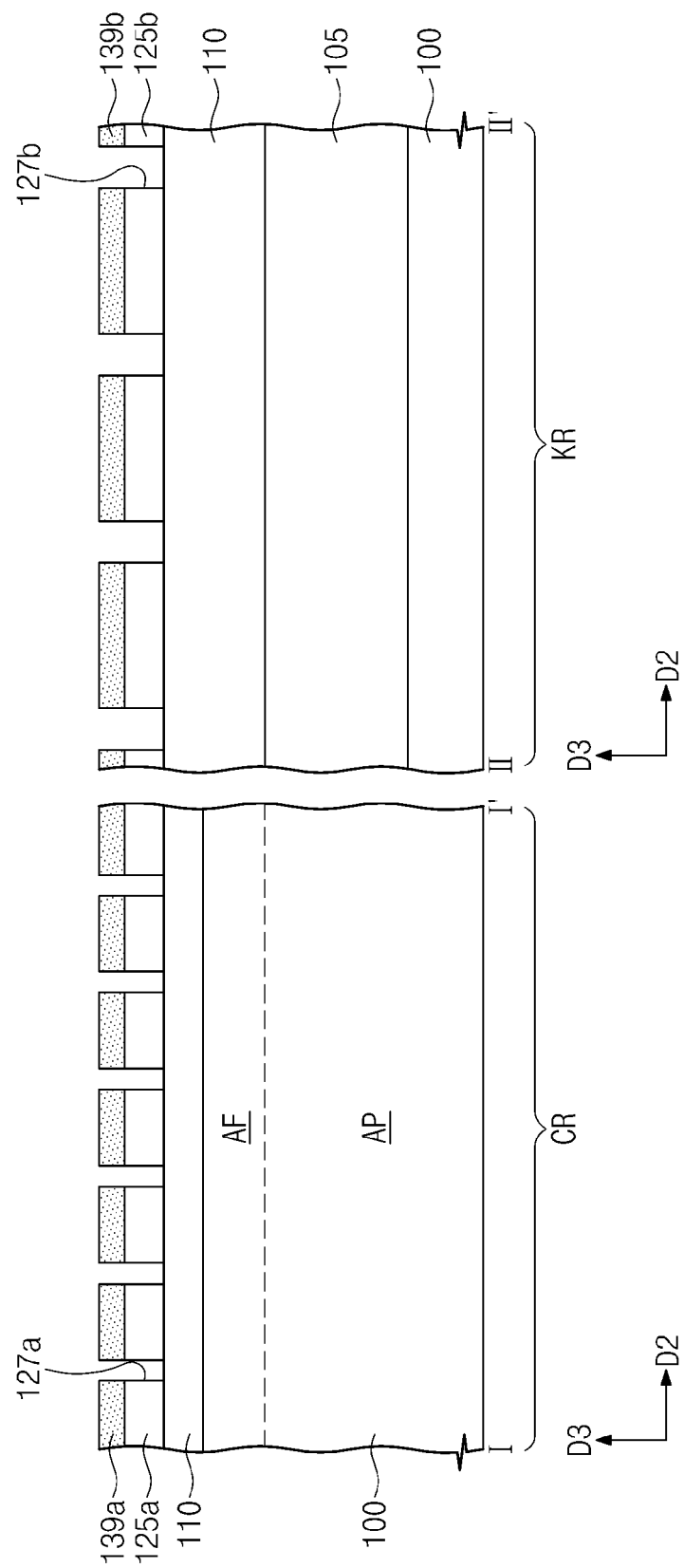
Figure 11B:
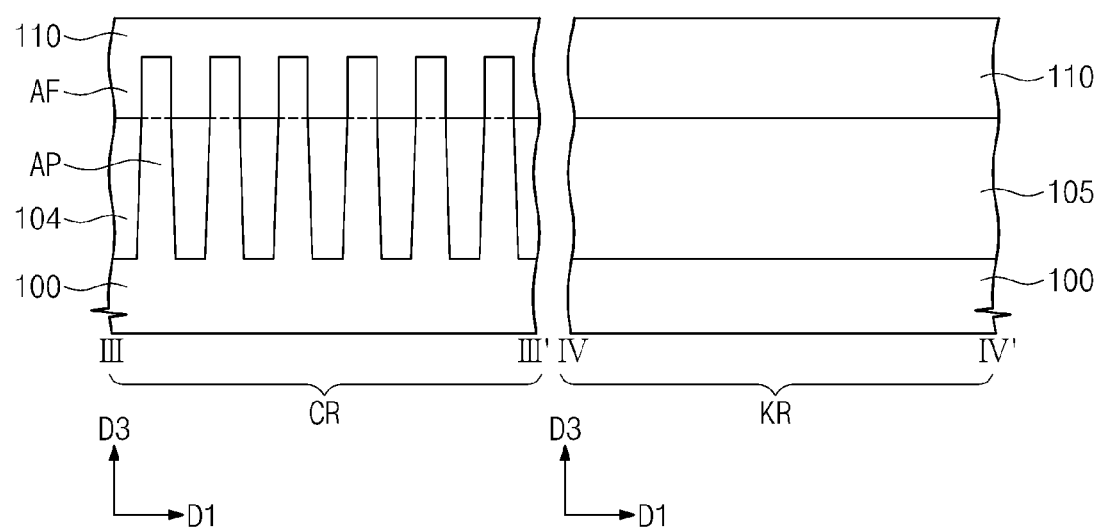

Referring to FIGS. 7, 11A, and 11B, first and second mask patterns 139a and 139b may be formed in the first and second preliminary trenches 137a and 137b, respectively. Firstly, the remaining portions of the first and second spacers 147a and 147b may be removed. Thereafter, a mask layer (not shown) may be formed on the second mold layer 120 to cover the first and second upper mold patterns 135a and 135b. Next, a planarization process may be performed on the mask layer to expose top surfaces of the first and second upper mold patterns 135a and 135b. As a result, the first mask patterns 139a may be formed to fill the first preliminary trenches 137a, and the second mask patterns 139b may be formed to fill the second preliminary trenches 137b.

Thereafter, the first and second upper mold patterns 135a and 135b may be removed. First trenches 127a may be formed to expose the top surface of the second mold layer 120 between the first mask patterns 139a. Second trenches 127b may be formed to expose the top surface of the second mold layer 120 between the second mask patterns 139b. Thereafter, the second mold layer 120 may be etched using the first and second mask patterns 139a and 139b as an etch mask to form first mold mask patterns and second mold mask patterns. Accordingly, the first and second trenches 127a and 127b may extend into the second mold layer 120.

Figure 12B:
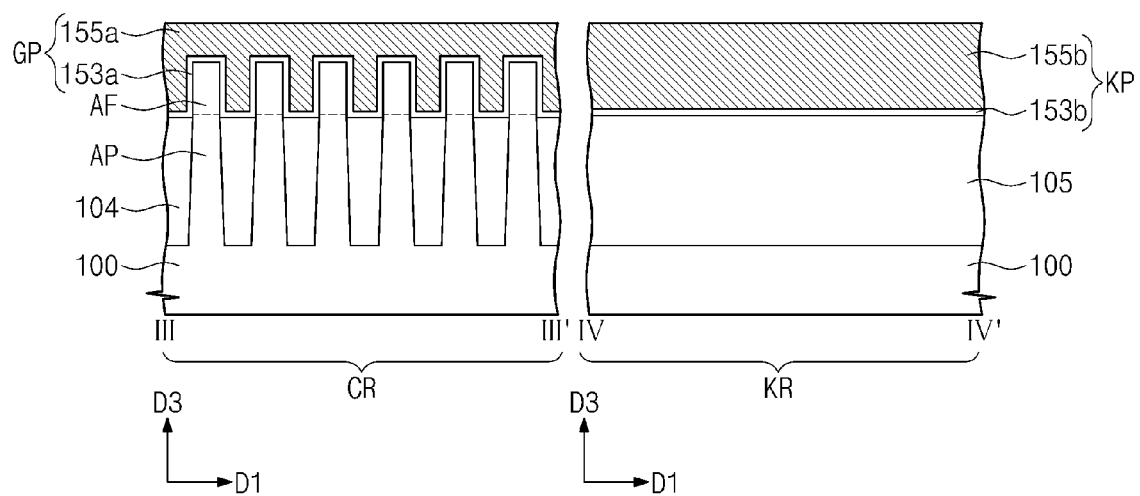

Referring to FIGS. 7, 12A, and 12B, the first and second mask patterns 139a and 139b may be removed. Thereafter, the first mold layer 110 may be etched using the first and second mold mask patterns 125a and 125b as an etch mask to form first lower mold patterns 115a and second lower mold patterns 115b. Accordingly, the first and second trenches 127a and 127b may extend into the first mold layer 110.

The first trenches 127a may be formed to partially expose the top and side surfaces of the active fins AF. The second trenches 127b may be formed to partially expose the top surface of the insulating layer 105. When viewed in a plan view, the first trenches 127a may have a shape corresponding to the shape of the first spacers 147a. In other words, the widths of the first trenches 127a may be substantially equal to the widths of the first spacers 147a. When viewed in a plan view, the second trenches 127b may have a shape corresponding to the shape of the second spacers 147b. In other words, the widths of the second trenches 127b may be substantially equal to the widths of the second spacers 147b.

Thereafter, the first and second mold mask patterns 125a and 125b may be removed. Gate patterns GP may be formed in the first trenches 127a and key patterns KP may be formed in the second trenches 127b.

For example, a dielectric layer (not shown) may be conformally formed on the substrate 100. The dielectric layer may be formed not to completely fill the first and second trenches 127a and 127b. On the first region CR, the dielectric layer may cover partially the top and side surfaces of the active fins AF. The dielectric layer may extend to partially cover the top and side surface of the first lower mold patterns 115a. On the second region KR, the dielectric layer may cover partially the top surface of the insulating layer 105. The dielectric layer may extend to partially cover the top and side surfaces of the second lower mold patterns 115b.

A conductive layer (not shown) may be formed on the dielectric layer to fill the first and second trenches 127a and 127b. A planarization process may be performed on the conductive layer to form the gate patterns GP and the key patterns KP in the first and second trenches 127a and 127b, respectively. Accordingly, one or more of the gate patterns GP may include a first conductive line 155a and a gate dielectric layer 153a interposed between the first conductive line 155a and the substrate 100. One or more of the key patterns KP may include a second conductive line 155b and a key dielectric layer 153b interposed between the second conductive line 155b and the substrate 100.

When viewed in a plan view, the gate patterns GP may have a shape corresponding to the shape of the first spacers 147a. For example, the gate patterns GP may be shaped like a line and may be formed to partially cover the top and side surfaces of the active fins AF and extend in a direction parallel to the first direction D1. When viewed in a plan view, the key patterns KP may have a shape corresponding to the shape of the second spacers 147b. The key patterns KP may extend in a direction parallel to the first direction D1 on the insulating layer 105 and may also be shaped like a line.

Figure 13A:
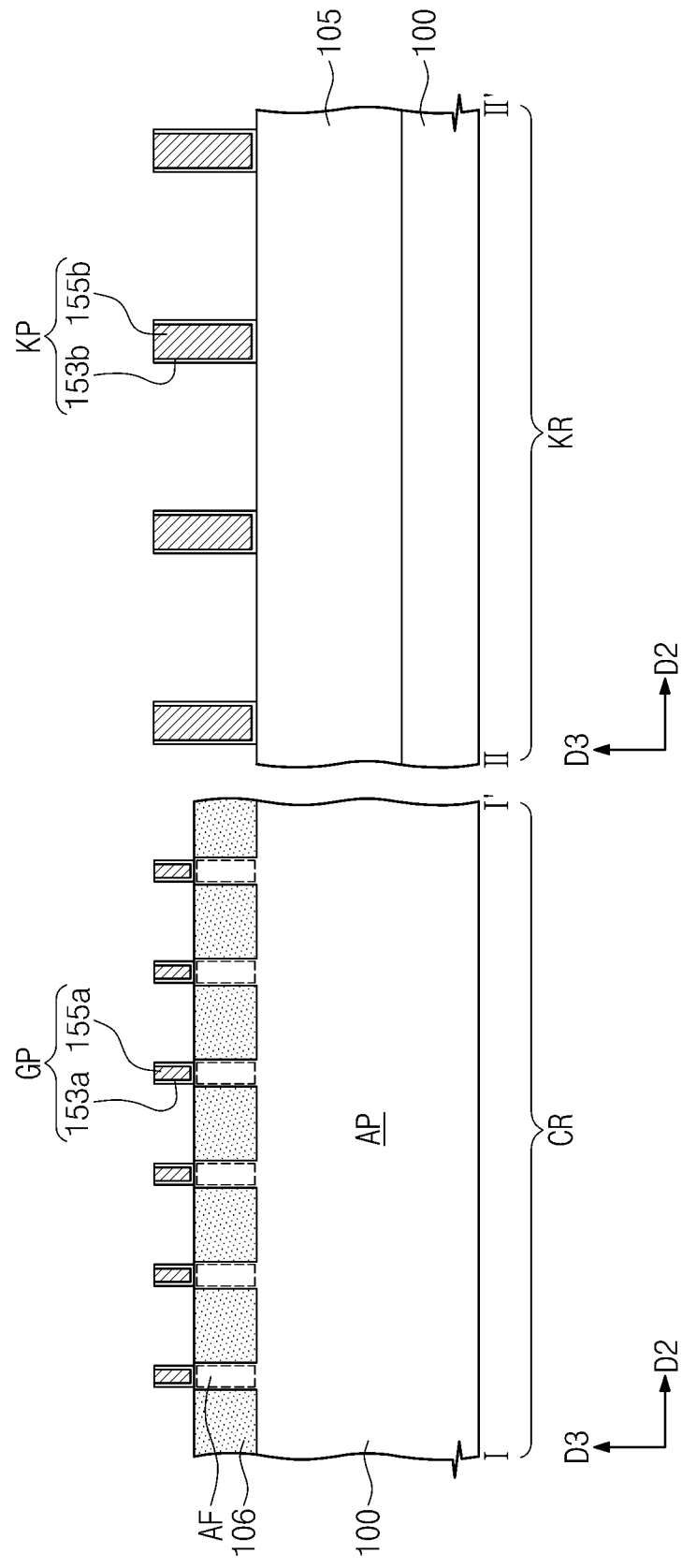
Figure 13B:
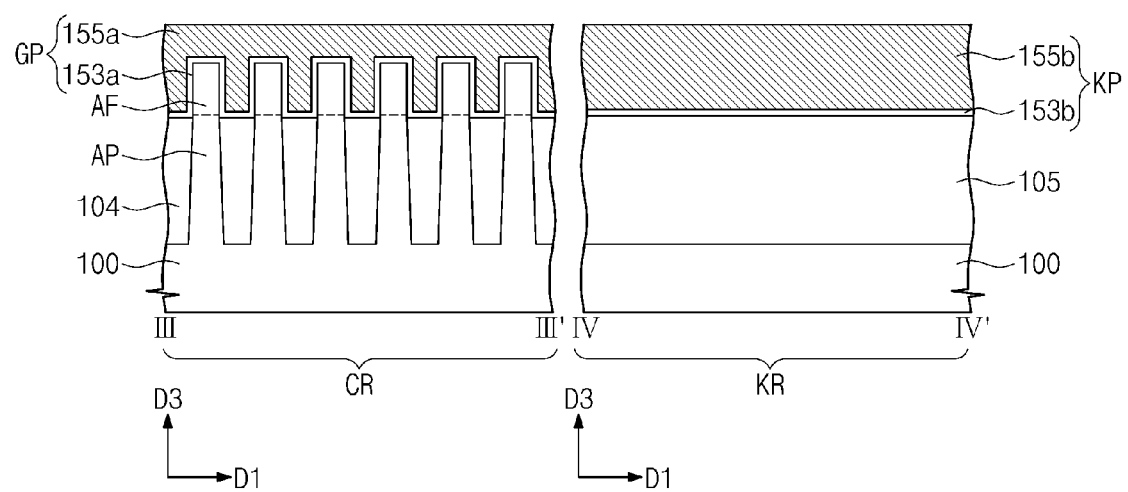

Referring to FIGS. 7, 13A, and 13B, the first and second lower mold patterns 115a and 115b may be removed and source/drain regions 106 may be formed in the active fins AF between the gate patterns GP. The source/drain regions 106 may serve as source/drain electrodes of a field effect transistor according to example embodiments of the inventive concepts. Also, portions of the active fins AF positioned between the source/drain regions 106 may serve as a channel region CHR of the field effect transistor.

The formation of the source/drain regions 106 may include removing the source/drain regions and performing a selective epitaxial growth process using the substrate 100 as a seed layer. The source/drain regions 106 may be doped with dopants to have a second conductivity type that is different from the conductivity type of the active patterns AP. Unlike the shown example, top surfaces of the source/drain regions 106 may have a non-zero curvature. For example, one or more of the source/drain regions 106 may have an upwardly-convex top surface.

The source/drain regions 106 may contain a semiconductor element that is different from the semiconductor element of the substrate 100. For example, the source/drain regions 106 may contain a semiconductor material having a lattice constant that is greater or smaller than a lattice constant of the substrate 100. Since the semiconductor element of the source/drain regions 106 differs from the semiconductor element of the substrate 100, a compressive or tensile force may be exerted on the channel regions CHR. For example, in the case where the substrate 100 is a silicon wafer and the source/drain regions 106 are formed of or include silicon-germanium or germanium, a compressive force may be exerted on the channel regions CHR. The source/drain regions 106 with such a structure may be used to realize PMOS field effect transistors. As another example, in the case where the substrate 100 is a silicon wafer and the source/drain regions 106 are formed of or include silicon carbide (SiC), a tensile force may be exerted on the channel regions CHR. The source/drain regions 106 with such a structure may be used to realize NMOS field effect transistors. Likewise, since the source/drain regions 106 are configured to exert the compressive or tensile force on the channel regions CHR, it is possible to increase a carrier mobility of the channel region CHR, in the field effect transistor according to example embodiments of the inventive concepts.

Thereafter, although not shown, a metal silicide layer may be further formed on one or more of the source/drain regions 106. The metal silicide layer may be formed through a reaction between a semiconductor element contained in the source/drain regions 106 with a metallic material provided thereon.

Referring back to FIGS. 7, 8A, and 8B, an interlayered insulating layer 160 may be formed to cover the gate patterns GP and the key patterns KP. A photolithography process may be performed to form contact holes 171 penetrating the interlayered insulating layer 160 and exposing the source/drain regions 106. During the photolithography process, the key patterns KP may be used to align the contact holes 171 between the gate patterns GP, and this process may be performed using the same method as the method described with reference to FIGS. 1 and 3K.

Contact plugs 173 may be formed by filling the contact holes 171 with a conductive material. The contact plugs 173 may be formed between the gate patterns GP. Further, the contact plugs 173 may be coupled to the source/drain regions 106, respectively. Metal lines 175 may be formed on the contact plugs 173.

Figure 14:
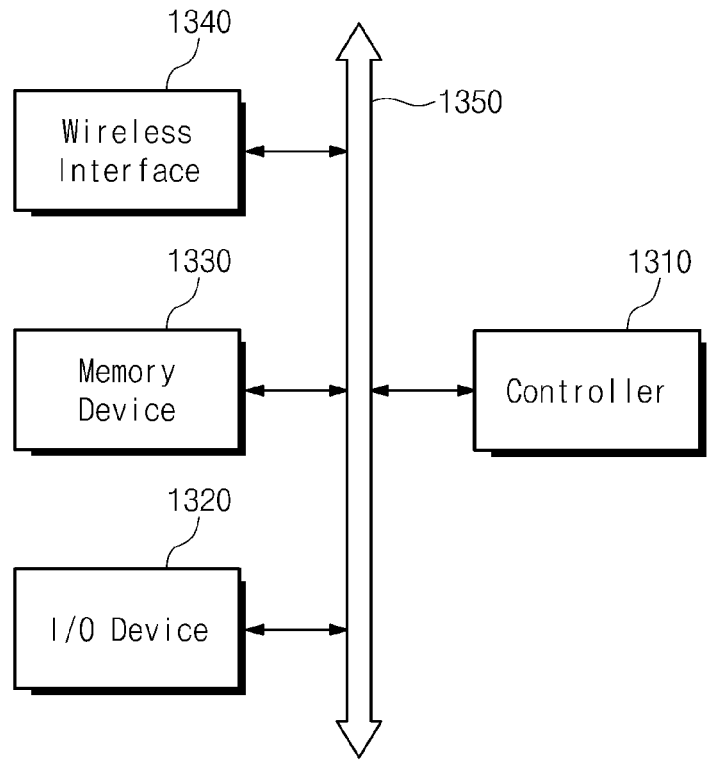
FIGS. 14 and 15 are schematic block diagrams illustrating electronic devices including a semiconductor device according to example embodiments of the inventive concepts.
Figure 15:
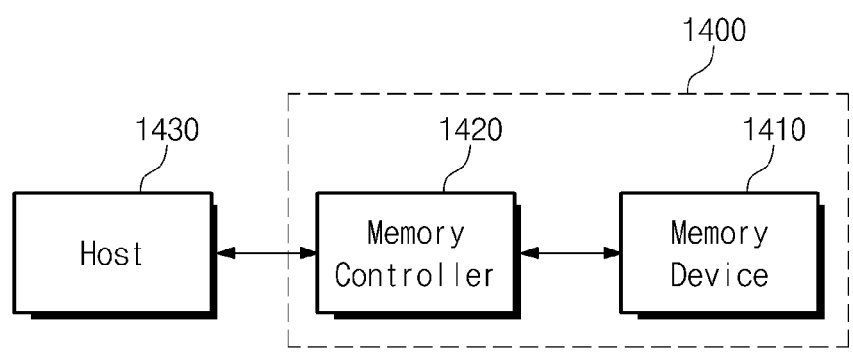

FIGS. 14 and 15 are schematic block diagrams illustrating electronic devices including a semiconductor device according to example embodiments of the inventive concepts.

Referring to FIG. 14, an electronic device 1300 including a semiconductor device according to example embodiments of inventive concepts may be used in one of a personal digital assistant (PDA), a laptop computer, a mobile computer, a web tablet, a wireless phone, a cell phone, a digital music player, a wire or wireless electronic device, or a complex electronic device including at least two ones thereof. The electronic device 1300 may include a controller 1310, an input/output device 1320 such as a keypad, a keyboard, a display, a memory 1330, and a wireless interface 1340 that are combined to each other through a bus 1350. The controller 1310 may include, for example, at least one microprocessor, a digital signal process, a microcontroller or the like. The memory 1330 may be configured to store a command code to be used by the controller 1310 or a user data. The memory 1330 may include a semiconductor device according to example embodiments of inventive concepts. The electronic device 1300 may use a wireless interface 1340 configured to transmit data to or receive data from a wireless communication network using a RF signal. The wireless interface 1340 may include, for example, an antenna, a wireless transceiver and so on. The electronic system 1300 may be used in a communication interface protocol of a communication system such as Code Division Multiple Access (CDMA), Global System Mobile (GSM), North America Digital Communications (NADC), Extended Time Division Multiple Access (E-TDMA), Wideband Code Division Multiple Access (WCDMA), Code Division Multiple Access (CDMA) 2000, Wi-Fi, Municipal Wireless Network (Muni Wi-Fi), Bluetooth, Digital Enhanced Cordless Telecommunications (DECT), Wireless Universal Serial Bus (USB), Flash Orthogonal Frequency Division Multiplexing (Flash-OFDM), Institute of Electrical and Electronics Engineers (IEEE) 802.20, General Packet Radio Service (GPRS), iBurst, WiBro, WiMAX, WiMAX-Advanced, Universal Mobile Telecommunication System—Time Division Duplexing (UMTS-TDD), High Speed Packet Access (HSPA), Evolution Data Optimized (EVDO), Long Term Evolution (LTE-Advanced), Multi-Channel Multi-Point Distribution Service (MMDS), and so forth.

Referring to FIG. 15, a memory system including a semiconductor device according to example embodiments of inventive concepts will be described. The memory system 1400 may include a memory device 1410 for storing huge amounts of data and a memory controller 1420. The memory controller 1420 controls the memory device 1410 so as to read data stored in the memory device 1410 or to write data into the memory device 1410 in response to a read/write request of a host 1430. The memory controller 1420 may include an address mapping table for mapping an address provided from the host 1430 (e.g., a mobile device or a computer system) into a physical address of the memory device 1410. The memory device 1410 may be a semiconductor device according to example embodiments of inventive concepts.

According to example embodiments of the inventive concepts, gate patterns and key patterns may be simultaneously formed on a cell region and a scribe lane region, respectively. Here, the key patterns may be formed to have a large width and a larger pitch than those of the gate patterns. Accordingly, it is possible to reduce a void from being formed in the key patterns and reduce or substantially prevent the key patterns from being leaned. As a result, it is possible to improve a technical issue of misreading the key patterns, when contact plugs are formed at both sides of gate patterns.

While example embodiments of the inventive concepts have been particularly shown and described, it will be understood by one of ordinary skill in the art that variations in form and detail may be made therein without departing from the spirit and scope of the attached claims.

What is claimed is:

1. A method of forming key patterns, comprising:
forming a first mold layer and a second mold layer on a substrate;
forming sacrificial patterns on the second mold layer;
forming a spacer layer to conformally substantially cover the sacrificial patterns;
anisotropically etching the spacer layer to form spacers at opposite sides of the sacrificial patterns, at least one spacer filling a space between an adjacent pair of the sacrificial patterns;
etching the second mold layer using the spacers as an etch mask to form preliminary trenches;
forming mask patterns in the preliminary trenches;
etching the first mold layer using the mask patterns as an etch mask to form trenches; and
filling the trenches with a conductive material to form key patterns in the trenches.

2. The method of claim 1, wherein a distance between the adjacent pair of sacrificial patterns is 1.5 times to 2.5 times a thickness of the spacer layer.

3. The method of claim 2, wherein one or more of the key patterns is formed to have a width substantially corresponding to the distance between the adjacent pair of sacrificial patterns.

4. The method of claim 1, wherein the forming of the spacers comprises:
anisotropically etching the spacer layer to expose top surfaces of the sacrificial patterns; and
selectively removing the sacrificial patterns.

5. The method of claim 1, wherein the forming the trenches comprises superimposing the trenches on the spacers.

6. The method of claim 5, further comprising:
forming a third mold layer interposed between the substrate and the first mold layer, wherein the forming of the trenches further comprises:
etching the first mold layer using the mask patterns as an etch mask to form mold mask patterns; and
etching the third mold layer using the mold mask patterns as an etch mask to form the trenches.

7. The method of claim 5, further comprising:
forming a third mold layer interposed between the substrate and the first mold layer, wherein
the second mold layer includes at least one of a silicon oxide layer, a silicon nitride layer, and a silicon oxynitride layer,
the third mold layer includes at least one of a silicon oxide layer, a silicon nitride layer, and a silicon oxynitride layer, and
the first mold layer includes at least one of a material having an etch selectivity with respect to the second and third mold layers.

8. The method of claim 1, wherein
a distance between the adjacent pair of sacrificial patterns is 1.5 to 2 times a thickness of the spacer layer, and
the spacers are formed to connect adjacent pairs of the sacrificial patterns to each other, thereby serving as connection spacers filling spaces between the adjacent pairs of the sacrificial patterns.

9. The method of claim 8, wherein
the pairs of sacrificial patterns are spaced apart from each other in a specific direction by a specific distance, and
a maximum width of the connection spacers in the specific direction is substantially the same as the distance between the pair of sacrificial patterns.

10. The method of claim 1, wherein
a distance between the adjacent pair of sacrificial patterns is 2 to 2.5 times a thickness of the spacer layer, and
the pair of the spacers are spaced apart from each other between the adjacent pair of sacrificial patterns to form an empty space.

11. The method of claim 10, further comprising:
forming a third mold layer interposed between the substrate and the first mold layer, wherein
the forming of the preliminary trenches and of the trenches includes
etching the second mold layer using the spacers as an etch mask to form the preliminary trenches and grooves, the grooves being formed in the second mold layer to extend from the empty spaces toward the substrate;
forming the mask patterns in the preliminary trenches;
etching the first mold layer using the mask patterns as an etch mask to form mold mask patterns; and etching the third mold layer using the mold mask patterns as an etch mask to form the trenches extending into the third mold layer, wherein the grooves have bottom surfaces positioned at substantially a same level as or a higher level than bottom surfaces of the preliminary trenches.

12. The method of claim 11, wherein the grooves have widths that are gradually decreasing in a direction toward the substrate, and the grooves have an upper width of 10 nm or less.

13. A method of fabricating a semiconductor device, comprising:

forming a first mold layer and a second mold layer to substantially cover a first region and a second region of a substrate;

forming first and second sacrificial patterns on the first and second regions, respectively, of the second mold layer;

forming a spacer layer on the substrate to substantially conformally cover the first and second sacrificial patterns;

anisotropically etching the spacer layer to form first and second spacers on opposite sides of the first and second sacrificial patterns, respectively;

etching the second mold layer using the first and second spacers as an etch mask to form first and second preliminary trenches on the first and second regions, respectively;

forming first and second mask patterns in the first and second preliminary trenches, respectively; and etching the first mold layer using the first and second mask patterns as an etch mask to form first trenches and second trenches, respectively, wherein a width of one or more of the second sacrificial patterns is greater than a width of one or more of the first sacrificial patterns.

14. The method of claim 13, wherein the forming the second sacrificial patterns forms one or more second sacrificial patterns that have a width that is 1.5 to 2 times a width of one or more of the first sacrificial patterns.

15. The method of claim 13, wherein the forming the second sacrificial patterns forms one or more second sacrificial patterns with a pitch that is substantially equal to a pitch of one or more of the first sacrificial patterns.

16. The method of claim 13, wherein the forming the first sacrificial patterns forms first sacrificial patterns having a distance between adjacent pairs thereof that is greater than a distance between a pair of adjacent second sacrificial patterns.

17. A method of fabricating a semiconductor device, the method comprising:

providing a substrate including a first region and a second region;

forming gate patterns on the first region; and forming key patterns on the second region, wherein a width of the key patterns is equal to 1.5 to 2.5 times a width of the gate patterns, and the gate and key patterns include a substantially same material.

18. The method of claim 17, wherein a distance between a pair of adjacent key patterns is 1.5 to 2 times a distance between adjacent gate patterns.

19. The method of claim 17, wherein a pitch of the key patterns is two times a pitch of the gate patterns.

20. The method of claim 17, wherein the first region is a cell region and the second region is a scribe region.

* * * * *